United States Patent
Carson et al.

(10) Patent No.: US 10,944,242 B2
(45) Date of Patent: Mar. 9, 2021

(54) SURFACE-MOUNT COMPATIBLE VCSEL ARRAY

(71) Applicant: Lumentum Operations LLC, San Jose, CA (US)

(72) Inventors: Richard F. Carson, Albuquerque, NM (US); Nein-Yi Li, Albuquerque, NM (US); Mial E. Warren, Albuquerque, NM (US)

(73) Assignee: Lumentum Operations LLC, San Jose, CA (US)

( * ) Notice: Subject to any disclaimer, the term of this patent is extended or adjusted under 35 U.S.C. 154(b) by 0 days.

(21) Appl. No.: 16/627,958

(22) PCT Filed: Aug. 13, 2018

(86) PCT No.: PCT/US2018/046552
§ 371 (c)(1),
(2) Date: Dec. 31, 2019

(87) PCT Pub. No.: WO2019/036383
PCT Pub. Date: Feb. 21, 2019

(65) Prior Publication Data
US 2020/0169065 A1    May 28, 2020

Related U.S. Application Data

(60) Provisional application No. 62/545,363, filed on Aug. 14, 2017.

(51) Int. Cl.
*H01S 5/42*    (2006.01)
*H01S 5/022*   (2006.01)
(Continued)

(52) U.S. Cl.
CPC .......... *H01S 5/423* (2013.01); *H01S 5/02272* (2013.01); *H01S 5/02469* (2013.01);
(Continued)

(58) Field of Classification Search
CPC .. H01S 5/423; H01S 5/02272; H01S 5/02469; H01S 5/042; H01S 5/18305; H01S 5/18327; H01S 5/18341; H01S 5/18344
See application file for complete search history.

(56) References Cited

U.S. PATENT DOCUMENTS

| 7,949,024 B2 | 5/2011 | Joseph |
| 9,746,369 B2 | 8/2017 | Shpunt et al. |
| (Continued) | | |

FOREIGN PATENT DOCUMENTS

| TW | 201507303 A | 2/2015 |
| TW | 201724442 A | 7/2017 |

OTHER PUBLICATIONS

International Patent Application No. PCT/US2018/046552; Int'l Preliminary Report on Patentability; dated Feb. 27, 2020; 6 pages.
(Continued)

*Primary Examiner* — Armando Rodriguez
(74) *Attorney, Agent, or Firm* — Harrity & Harrity, LLP

(57) ABSTRACT

A VCSEL/VECSEL array design is disclosed that results in arrays that can be directly soldered to a PCB using conventional surface-mount assembly and soldering techniques for mass production. The completed VCSEL array does not need a separate package and no precision sub-mount and flip-chip bonding processes are required. The design allows for on-wafer probing of the completed arrays prior to singulation of the die from the wafer. Embodiments relate to semiconductor devices, and more particularly to multibeam arrays of semiconductor lasers for high power and high frequency applications and methods of making and using the same.

60 Claims, 13 Drawing Sheets

(51) Int. Cl.
*H01S 5/024* (2006.01)
*H01S 5/042* (2006.01)
*H01S 5/183* (2006.01)

(52) U.S. Cl.
CPC .......... *H01S 5/042* (2013.01); *H01S 5/18305* (2013.01); *H01S 5/18327* (2013.01); *H01S 5/18341* (2013.01); *H01S 5/18344* (2013.01)

(56) References Cited

U.S. PATENT DOCUMENTS

| | | |
|---|---|---|
| 2005/0169336 A1 | 8/2005 | Ishii et al. |
| 2010/0303113 A1 | 12/2010 | Joseph |
| 2012/0086765 A1 | 4/2012 | Higashi et al. |
| 2015/0146749 A1 | 5/2015 | Hoshino et al. |
| 2017/0070027 A1 | 3/2017 | Kondo et al. |

OTHER PUBLICATIONS

International Patent Application No. PCT/US2018/046552; Int'l Search Report and the Written Opinion; dated Oct. 29, 2018; 12 pages.

SURFACE-MOUNT COMPATIBLE VCSEL ARRAY

CROSS-REFERENCE TO RELATED APPLICATION

This application is a U.S national phase application of International Application No. PCT/US2018/046552, filed on Aug. 13, 2018, which claims benefit of U.S. Provisional Patent Application No. 62/545,363, filed Aug. 14, 2017.

FIELD OF THE DISCLOSURE

The present disclosure relates to semiconductor devices, and more particularly to multibeam arrays of semiconductor lasers.

BACKGROUND

Vertical-cavity surface-emitting lasers (VCSELs) are a versatile type of semiconductor laser with unique performance advantages. They are currently used in high-speed data communications, optical sensing applications, such as proximity sensing, and laser radar. The devices are fabricated by epitaxial growth of the laser cavity, in layer form, on the surface of a wafer of semiconductor material, typically gallium arsenide. As a result, they emit light in a direction perpendicular to the wafer surface. Since it is not necessary to cleave the semiconductor wafer to form the laser cavity, as is required for edge-emitting semiconductor lasers, the devices can be readily fabricated in one and two-dimensional arrays of VCSELs in a single semiconductor die. The arrays of VCSELs provide a way of scaling the output power to higher power levels and enable individual lasers or groups of lasers in the array to be configured for independent power and control.

Many designs or configurations of VCSELs have been proposed and manufactured. Most of these designs require some level of packaging to provide protection of the laser surfaces from the environment and to provide for connection to conventional printed circuit boards. A typical example is a top-emitting array of VCSELs in which an electrical connection is required at the top of the die. Typically, the anode (positive) contact is close to the light emitting junction and the cathode (negative) contact is the doped substrate of the die. In most examples, the anode contact is made via a wire bond to a pad on top of the die and the cathode contact is made via a solder bond at the bottom of the die.

These interconnections are not directly compatible with conventional printed wiring board (PWB) or printed circuit board (PCB) construction and cannot be used directly with high-speed, low-cost surface mount soldering processes commonly used to mass-produce electronic and opto-electronic systems. An electronic package is required to make the connections to the VCSEL die and that package has to have the appropriate metal pads or leads for soldering to the PCB. The package also provides protection for the VCSELs as the fabrication processes used often leave the sides of the epitaxial layers, which are exposed by etching of mesas or trenches, left unprotected, or only protected by the polymer layers used for planarization. The etched epitaxial layers need to be exposed for lateral oxidation, a commonly used process for current confinement in VCSELs. The long term exposure of these devices to atmospheric moisture is a known reliability problem that is usually dealt with by using a hermetically sealed package. Wire-bonded devices are also not easily scaled into two-dimensional arrays, especially if there is a need to contact many individual lasers or groups of lasers in the interior of the array.

Some VCSEL arrays are fabricated so light is emitted through the substrate wafer, either by emitting light at wavelengths for which the wafer is transparent or through a via in the wafer. In such architectures, the anode contact is made to the device by bonding the anode contact down to a conductive pad. In many designs, the cathode contact is still made to the semiconductor substrate surface. This allows for flip-chip bonding to be used for making the anode contact. Wire bonds may still be used to make the cathode contact to the substrate surface, which is now the top of the upside down device. A package is still needed in most cases to protect the device and provide pads for the wire bonds and then solder pads for attachment to the PCB. The need for wire bonds still severely limits the interconnect options for a two-dimensional array.

Such a configuration does have the advantage of the anode surface of the laser being in direct contact with the package substrate. This is an advantage because the p-n junction and mirror or DBR (Distributed Bragg Reflector) are near the anode contact and that is where most of the heat generated in the device is located. This makes the anode contact the most efficient surface for heat removal from the junction area.

The most versatile configuration of this type is shown as prior art device 10 in FIG. 1. In the illustrated design, both the anode (laser) 14 and cathode 16 contacts are made on the same side of the die 20. The anode contacts, 14, in this configuration allow current to flow through the semiconductor junctions to emit light. These contacts are positioned very close together for efficient use of the laser die. This allows a single flip-chip bond step to make all the electrical contacts. In addition, it allows for very flexible interconnection to individual lasers or groups of lasers in a two-dimensional array. The design uses etched mesas for both lateral oxidation and for electrical isolation of the anode contacts for each VCSEL. The mesas are completely encapsulated in a thick metal coating that provides protection from moisture and oxidation so that a hermetic package is not needed for reliable use. Light, 24, is emitted through the wavelength transparent die 20. A similar design is described in detail in U.S. Pat. No. 7,949,024, which is incorporated herein by reference in its entirety.

This design still requires flip-chip bonding to a precision sub-mount 12 that makes contact to the anode 14 and cathode 16 parts of the VCSEL array through contact pads 22 and 18, respectively, which have a fine pitch to match the anode and cathode contacts. Device 10 is often referred to as a precision sub-mount. The flip-chip bonding of a precision sub-mount requires temperatures, pressures and alignment tolerances that are not compatible with conventional PCB and surface-mount assemblies and soldering processes. For this reason, the precision sub-mount device 10 shown in FIG. 1 is used with a package that provides electrical contacts to the VCSEL array. The device 10 requires additional contact pads to provide contacts to a conventional package or PCB pads.

BRIEF DESCRIPTION

The present disclosure includes a VCSEL array design (or VECSEL—vertical-external-cavity surface-emitting laser) that results in a VCSEL/VECSEL (herein a "VCSEL") array (herein a "VCSEL array") that can be directly soldered to a PCB using conventional surface-mount assembly and soldering techniques for mass production. In the disclosure design, the completed VCSEL array does not need a separate package and no precision sub-mount and flip-chip bonding processes are required. An additional advantage of this design is that it allows for on-wafer probing of the completed VCSEL arrays prior to singulation of the die from the wafer.

Embodiments relate to semiconductor devices, and more particularly to multibeam arrays of semiconductor lasers for high power and high frequency applications and methods of making and using the same.

Embodiments may also be directed to a multibeam optoelectronic device, referred to as a VCSEL array device, which has high power, a high frequency response and a variety of possible interconnections to individual lasers or groups of lasers within the array that can be made directly to a conventional printed circuit board using surface mount assembly and soldering techniques that are well known to the electronic system manufacturing industry. The VCSEL array device may be a monolithic array of VCSELs comprised of two or more VCSELs and an array or a single short-circuited mesa device. The VCSELs of the VCSEL array may be spaced symmetrically or asymmetrical for optimum optical or electrical characteristics. The VCSELs may be spaced according to a mathematical function for improved optical properties or electrical power transfer and speed. The VCSELs may be positioned for electrical phase relationships between the laser elements in the array for high fidelity of data transmission or optimum power transfer to the lasers.

The lasers in the array may be connected to the solder pads of the device in many configurations, including series and parallel electrical connections and combinations of those. The solder pads of the device may also be configured as desired, including separate electrical contacts to individual VCSELs, small common electrical contacts to a small number of VCSELs, or large electrical contacts to a large number of VCSELs.

The active VCSELs in the array may be contacted to an intermediate metal anode contact layer on a planarizing dielectric surface. The short-circuited mesa or mesas in the device may also be contacted to separate metallic pads in the same intermediate metal contact layer to form the cathode connections in the device. The anode and cathode pads may be in the same plane, but separated from each other by lateral gaps between the pads, as determined by the designer for isolation between the anode and cathode sufficient for the voltages required for operation.

The pattern of the anode and cathode contact pads may be configured to allow parallel connection of VCSELs for the anode pads and the shorted mesas for the cathode pads. Each anode or cathode pad may then have additional metal patterned on their surface to provide additional height. The metal may be plated copper or other highly conductive metals patterned to provide uniform contact areas to match pad metal patterns to be fabricated on the PCB. The additional metal may include diffusion barrier metals and be topped with a solder alloy or discrete solder balls may be applied to the pads. The pad patterns may be designed for uniform solder wetting areas to facilitate surface mount processing. The resulting device may be compatible with standard surface mount assembly technology and not require an additional package.

Each VCSEL of the VCSEL array may be encompassed by a metal heat sink structure. The metal heat sink structure may increase the height of the mesa and its diameter so that heat is more efficiently removed from the VCSEL. The short-circuited mesas may be formed alongside the VCSELs. These devices form a short-circuit from the substrate ground layer in the die to cathode pad metal, completing the return to ground for the current flowing through the VCSELs. The metal heat sink structure may encapsulates both the VCSEL and shorted mesas so they are protected from moisture and other environmental factors.

The very short current paths through the VCSELs and the shorted mesas may minimize parasitic inductance in the device. The separation of the anode and cathode contact pads from the current path within the VCSEL array may minimize the parasitic capacitance in the device. Both act to increase power efficiency and high frequency response.

DETAILED DESCRIPTION

Two-dimensional arrays of VCSELs are capable of providing the higher output power needed for many applications and are separately capable of allowing specific elements or groups of elements of the array to be addressed for applications such as printing or producing directional or variable illumination patterns. Traditional approaches to fabricating arrays of VCSELs have often required at least one contact pad that must be connected by wire bonds. The wire bonds add packaging complexity and are a source of parasitic inductance that limits the bandwidth of the laser array when high current pulses are used.

U.S. Pat. No. 7,949,024 B2 describes the fabrication of etched mesas that are interconnected by flip-chip bonding to a separate submount with a metal interconnect pattern. The etched mesas are covered by an additional, conformal metal coating that provides for additional heat dissipation, environmental protection and for a larger contact area for the later flip-chip bonded assembly. Some of the mesas have a contact that allows current flow through the VCSEL device to produce light and others are electrically shorted so that current flows through metal that has been deposited on the outside of the mesas without going through the VCSEL device itself. An intra-cavity contact with a metal layer on the surface allows for lateral flow of current from the active (light-emitting) mesas to the shorted mesas. This architecture allows for both the anode and cathode contacts to be made on the same side of the laser die and for a single flip-chip assembly step to make all the contacts to a patterned sub-mount that provides the electrical contact to the mesas. This approach works very well for minimizing electrical parasitic inductance and capacitance or overall parasitic impedances for the array. However, the sub-mount is a high precision part that needs to have high thermal conductivity. This adds expense and the sub-mount still needs to be soldered to a PCB or put into a conventional sealed package that will in turn be soldered to a PCB assembly. The additional packaging is a source of further parasitic impedance.

An alternative approach is to build a VCSEL array that can be directly soldered to the PCB without an additional sub-mount or package. As described herein a VCSEL array design and fabrication process allows direct soldering of the VCSEL array to a PCB using conventional solder pad dimensions on the PCB and well-known surface-mount PCB assembly tools and processes, including tape and reel dispensing.

Figure 1:
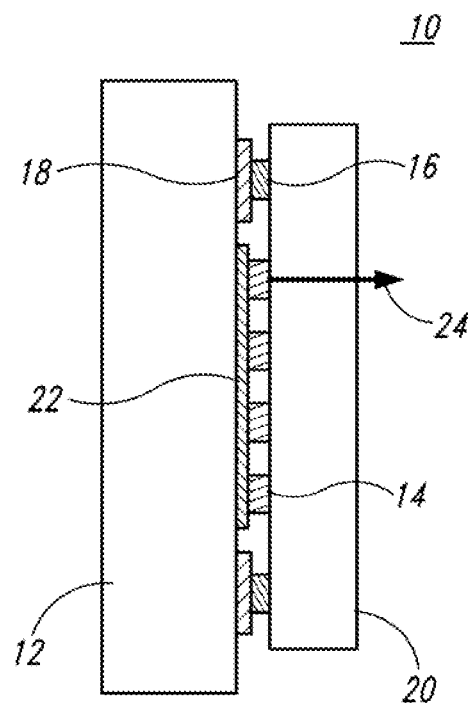
FIG. 1 is a side view illustrating a prior art flip-chip bonded array with a fine pitch.
Figure 2:
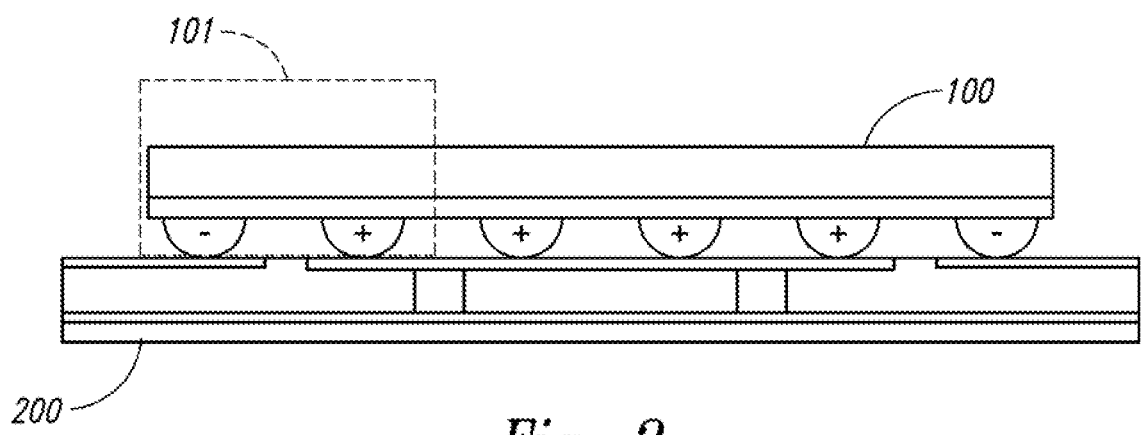
FIG. 2 is a cross-sectional side view illustrating a device in accordance with an embodiment.

FIG. 2 shows a simplified cross-section of VCSEL array device 100 in accordance with the embodiment. The illustration shows a semiconductor device that is an array of surface-emitting lasers and solder bump contacts that are on a simple geometric pattern with a size and pitch large enough for mounting directly to printed circuit boards by conventional assembly processes known to those of ordinary skill in the art. The figure depicts the VCSEL array soldered to a simplified printed circuit board 200.

The methods described herein may be used to fabricate arrays of other semiconductor devices, including external cavity versions of VCSELs, light emitting diodes, photodetectors, photomodulators and transistors. The illustration of the VCSEL device 100 is for illustration purposes and is not intended to limit the scope of the invention to any specific type of semiconductor device.

Figure 3:
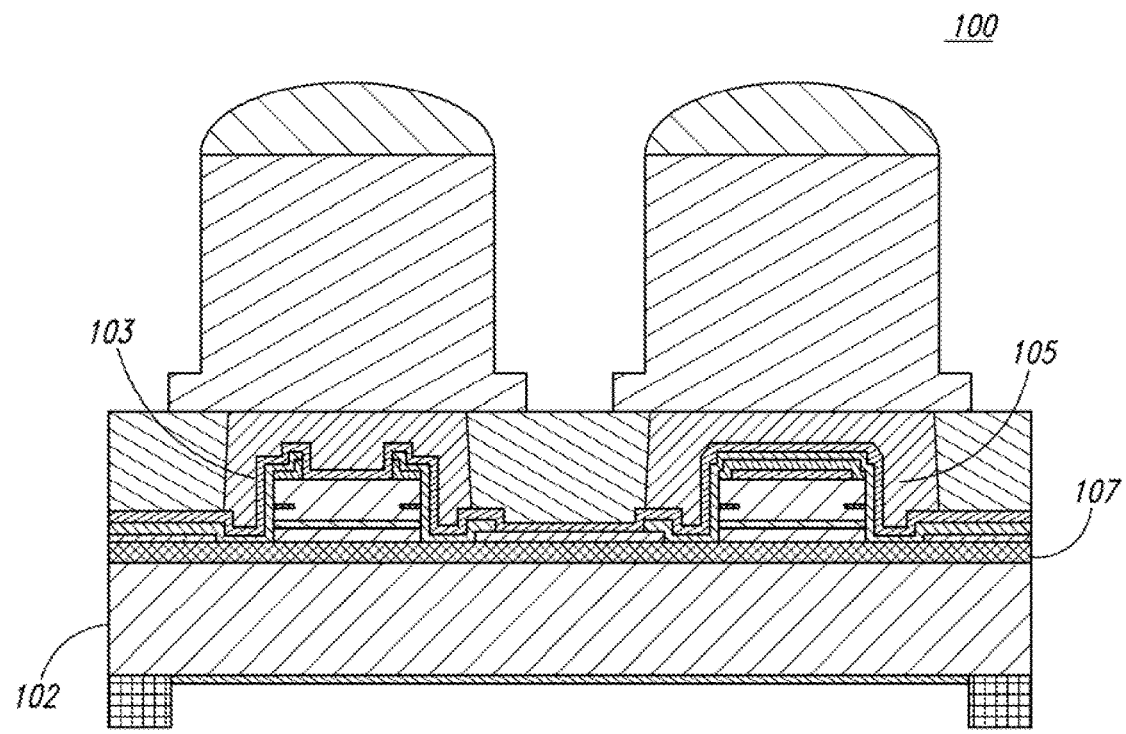
FIG. 3 is an inverted cross section illustrating the selected part 101 of FIG. 2.

FIG. 3 is an inverted more detailed illustration of the selected part 101 of FIG. 2. In the embodiment, VCSEL array device 100 may include a substrate 102 which includes Gallium Arsenide (GaAs) or other semiconductor materials, such as Indium Phosphide (InP), Gallium Nitride (GaN) or Silicon (Si). The substrate may be doped as n or p-type or may be undoped depending on the design requirements, wavelength of operation and placement of the contact layer. The substrate may also be a material, such as Aluminum Oxide ($Al_2O_3$) that can be used as a substrate for the growth of semiconductor materials on the surface. Subsequent layers of semiconductor material may be deposited on the surface of the substrate 102 by epitaxial growth processes, such as Molecular Beam Epitaxy (MBE) or Metal-Organo-Chemical Vapor Deposition (MOCVD).

Figure 4:
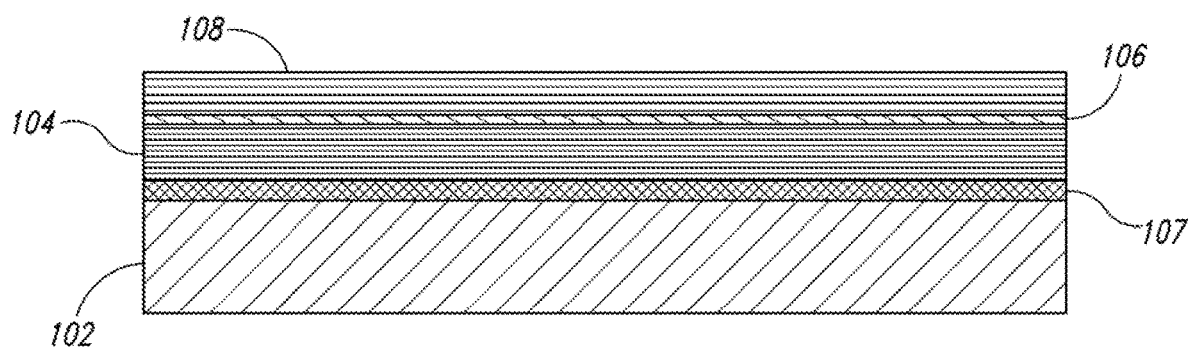
FIG. 4 illustrates the starting wafer, with epitaxially grown layers, of the embodiment of the device illustrated in FIG. 2.
Figure 5:
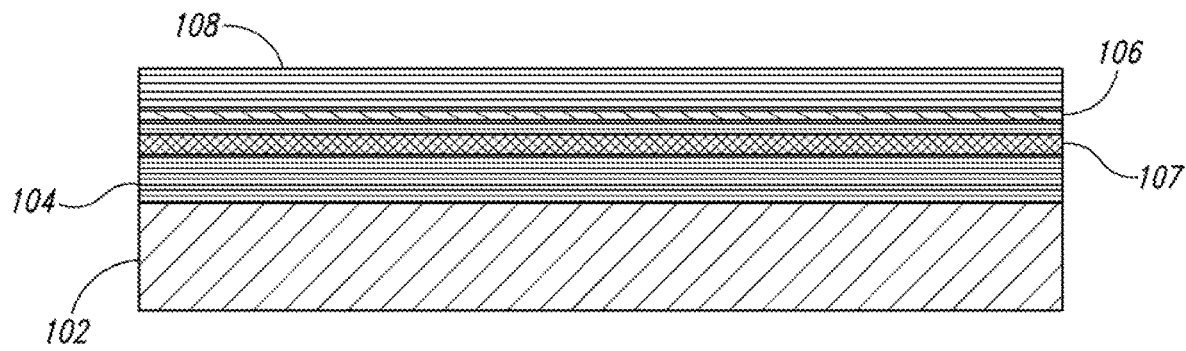
FIG. 5 is an alternative embodiment illustrating the starting wafer with epitaxially grown layers shown in FIG. 4.

In an embodiment, a starting wafer with epitaxially grown layers is shown in FIG. 4. A lattice-matched lower Distributed Bragg Reflector (DBR) 104 may be epitaxially deposited on substrate 102 (as shown in FIG. 5) or above the substrate 102 (as shown in FIG. 4) to form the first of the layers of the active VCSEL mesas 103 and the short-circuited or grounded mesas 105 (shown in FIG. 3). The lower DBR may be formed from multiple layers of alternating semiconductor alloys that have different indices of refraction. Each layer boundary causes a partial reflection of an optical wave with the combination of layers acting as a high-quality reflector at a desired wavelength of operation. While the lower DBR 104 and upper DBR 108 are composed of many layers of material, in order to simplify the illustration, in FIG. 4 they are depicted as a single material. A portion, or all, of the lower DBR 104 may also be conductive to allow current to flow through the VCSEL device. An intracavity contact layer 107 may be located either at the interface of the lower DBR 104 and the substrate 102 as shown in FIG. 4 or as a layer inside the lower DBR as shown in FIG. 5. The intracavity contact layer 107 may be a heavily doped semiconductor material to provide a conductive path connecting the mesas so as to allow lateral current flow through the device.

In an embodiment, an active region 106 may be epitaxially deposited on the lower DBR 104. Region 106 is again shown as a single material, but is actually composed of multiple layered materials to provide correct spacing for the desired resonance wavelength and conductivity for the current flow in the device. Region 106 may also have the gain medium that emits light with electrical current flow. The choice of material used for the gain medium and the dimensions of the other layers may serve to select a working wavelength, which may range from 620 nm to 1600 nm for a GaAs substrate. Other material choices may extend that wavelength range in either or both directions.

As is understood by those skilled in the art, the emission wavelength of the VCSEL is determined by the choices of materials and layer thicknesses of the materials in the lower DBR 104 and upper DBR 108, as well as the active region 106. The gain material may be quantum wells, quantum dots or other semiconductor structures.

In the embodiment, upper DBR 108 may be positioned on the active region 106 and may also be electrically conductive. In some embodiments, lower DBR 104 may be p-doped and upper DBR 108 maybe n-doped, but some embodiments may reverse that order. The upper DBR 108 may also be partly or completely composed of a non-conducting dielectric layer stack that is not epitaxially grown semiconductor material, but rather thin-film layers deposited by evaporation or sputtering with electrical contact made to an intracavity contact layer within or below the upper DBR. As depicted in FIGS. 4 and 5, all of these layers are typically in a single epitaxial structure grown on the substrate 102 which constitutes a starting point for subsequent processing steps. In FIG. 4, the lower DBR 104 is positioned above the intracavity contact layer 107 and in FIG. 5, the lower DBR 104 is positioned below the intracavity contact layer 107, in each case with the active region 106 between the lower DBR and upper DBR (forming the distributed DBR).

Figure 6:
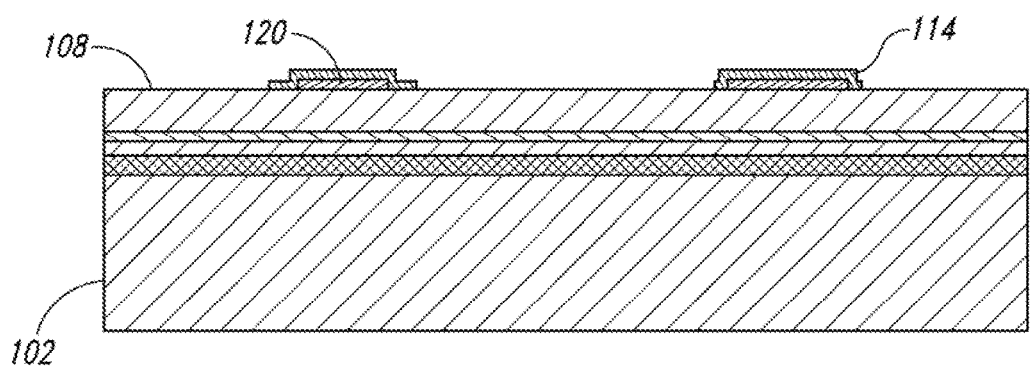
FIG. 6 illustrates the continued formation of an embodiment in which initial deposition and patterning of the contact metal to the upper DBR surface if performed using lithographic processes.

The upper DBR 108 may terminate in a heavily-doped contact layer to facilitate an ohmic contact to a metal contact layer, 120. FIG. 6 shows the initial deposition and patterning of the contact metal 120 to the upper DBR 108 surface, and the patterned dielectric layer 114 on top of the metal contact layer 120 using lithographic processes well known to those skilled in the art. If an ion-implanted confinement is part of the final structure, that implantation step may be performed prior to the contact. In that case, a prior metal deposition and patterning step may be performed to provide alignment features for the ion-implantation and subsequent steps.

Figure 7:
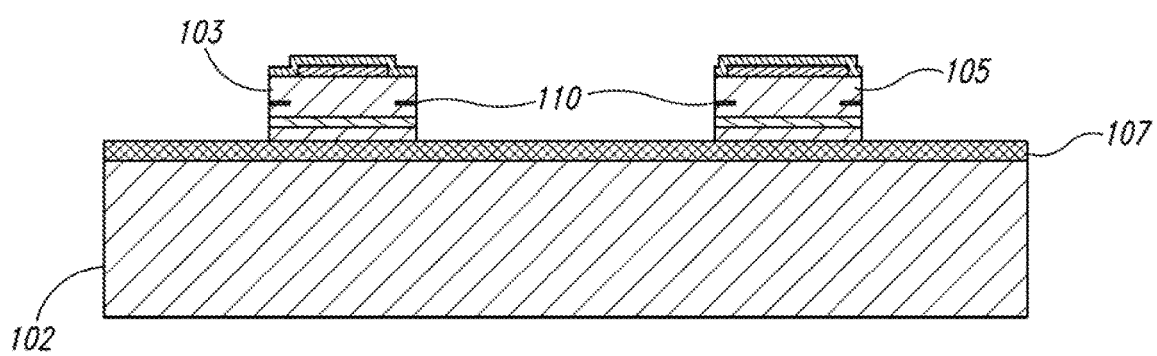
FIG. 7 illustrates the continued formation of the embodiment of FIG. 6 having photolithographically formed mesa structures.

The next step is illustrated in FIG. 7 and involves creation of the mesa structures 103 and 105. A robust photolithographically defined mask is needed for etching of the mesas into the epitaxial layer structure. This may use the patterned dielectric layer 114 (shown in FIG. 6), such as SiN or a combination of the dielectric material with a photoresist layer. The contact metal 120 patterned (as shown in FIG. 6) is also protected by this layer. The exposed sides of the mesas 103 and 105 shown in FIG. 7 allow for lateral oxidation of one or more high aluminum content AlGaAs layers 110 as one approach to charge carrier and light confinement in the mesa. Note that the contact metal on top of the mesas may still be covered by the dielectric etch mask at this stage. Photoresist layers that may be part of the etch mask can be removed at this point.

The mesa etch may be a controlled etch process using dry (plasma) or wet etch processes that stops at the intracavity contact layer 107, that is in the lower (n-type) DBR 104, or just under the DBR at the interface of the lower DBR 104 and the substrate 102. Selective etch stop layers may be part of the intracavity contact layer to produce a more uniform etch depth.

Figure 8:
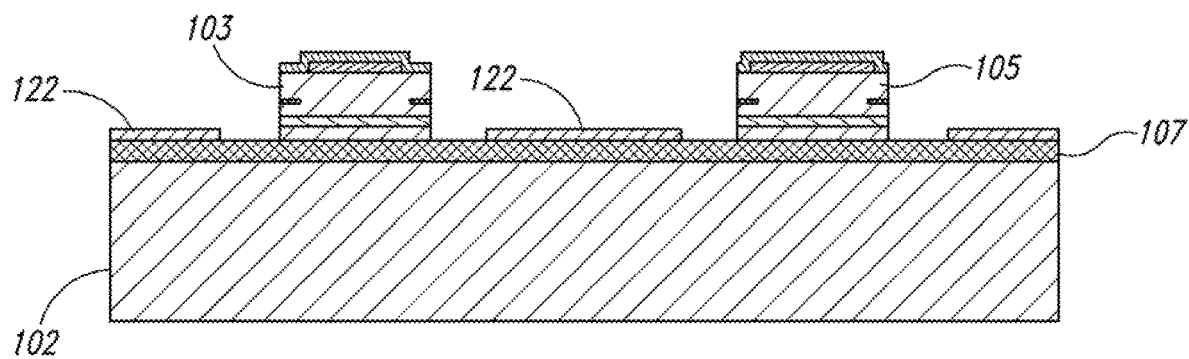
FIG. 8 illustrates the continued formation of the embodiment of FIG. 7 having n-metal deposition and patterning.

Another contact metal layer 122, as shown in FIG. 8, may be deposited and patterned at this point on the exposed surface of the intracavity contact layer 107. This may typically be a metal layer structure optimized for making an ohmic contact to the contact layer. This may also be the point at which thermal annealing may be used to interdiffuse the contact metal into the semiconductor material surface. The active light-emitting mesas are mesas 103 and the shorted mesas are mesas 105.

Figure 9:
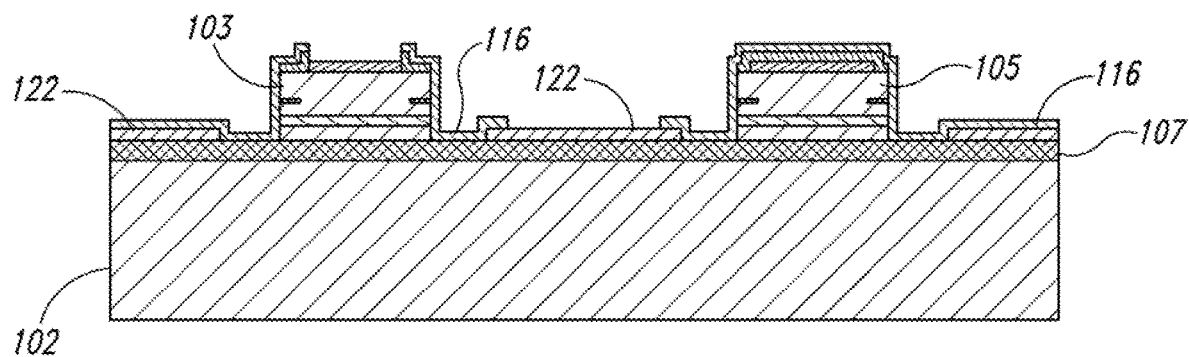
FIG. 9 illustrates the continued formation of the embodiment of FIG. 8 having a formed dielectric layers and etched vias.

As shown in FIG. 9, a second dielectric layer 116 may then be deposited on the wafer surface that covers all the features. This layer may allow for isolation of the shorted mesas from the active, light-emitting mesas. Another photolithography step may be used to define the regions of the dielectric layer 116 that need to be exposed by etching to allow electrical contact to the active mesas 103 where current will flow through the mesa structure to cause the laser to emit light. This step is also shown in FIG. 9. Note that the dielectric layer 116 may only be removed from selected areas of the n-contact metal 122.

Figure 10:
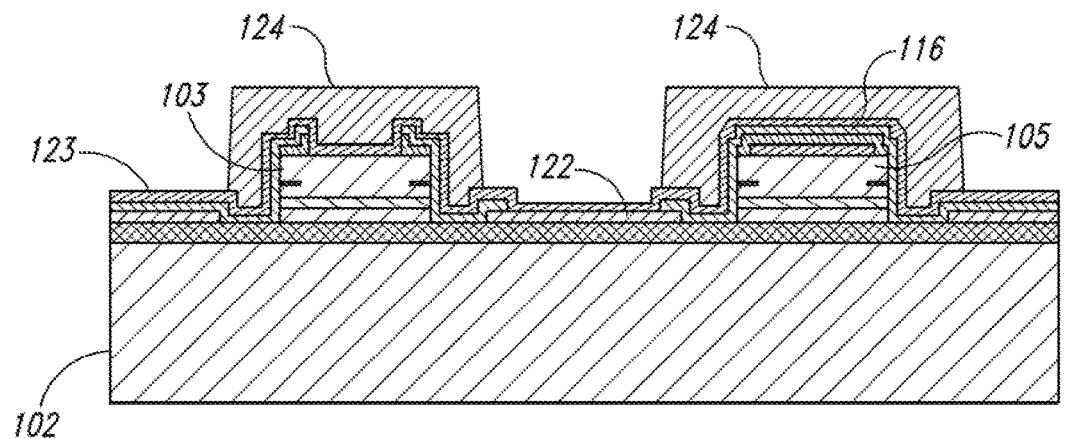
FIG. 10 illustrates the continued formation of the embodiment of FIG. 9 including the patterning and deposition of metal mesa caps.

The next step is illustrated in FIG. 10, where a thick metal cap 124 is shown formed over the mesas 124 to protect the mesas, to make an electrical connection to the n-contact metal for the shorted mesas, to act as the p-contact for the active mesas, and to provide additional heat transfer. If this metal cap 124 may be deposited by electroplating, a thin "seed" metal layer 123 may be deposited first across the entire wafer to provide electrical continuity. A thick photoresist mask may then be applied and photolithographically patterned for a thick metal deposition. Removal of the photoresist may then be followed by a selective etch of the exposed seed metal layer.

As noted, the thick metal cap 124 on the mesas may be in electrical contact to the n-contact metal on the active laser mesas 103 while being separated from the mesa surface and the p-contact metal on the shorted mesas 105 by the remaining dielectric layer 116. The thick metal cap 124 on the shorted mesas 105 overlap exposed area of the n-contact metal. This allows the return current from the VCSEL mesas to flow through the n-contact metal where it is in contact with the intracavity contact layer in or near the lower DBR 108 to the metal cap on the shorted mesas. Then the current flow does not go through the shorted mesa, but flows through the thick metal heat sink cap, 124. The resulting structure is shown is FIG. 10.

The metal mesa caps 124 may necessarily be on the same pitch as the mesas and may only be several microns larger than the original mesas depending on the thickness of the additional metal. An efficient VCSEL array may have the mesas located on a fine pitch and the mesas may usually be limited in size. The mesa caps 124 do not provide a compatible interface to solder pads on conventional PCBs.

Figure 11:
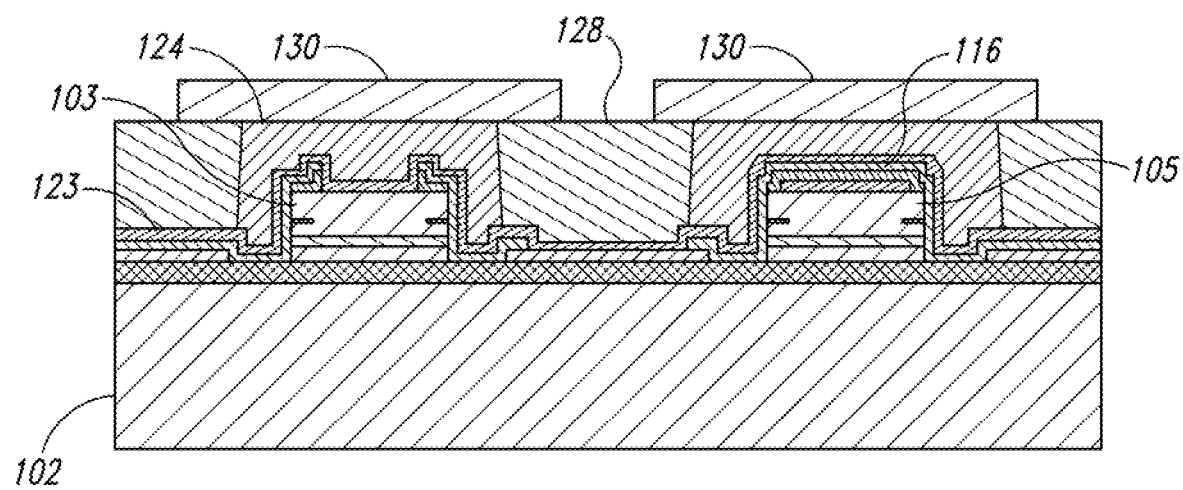
FIG. 11 illustrates the continued formation of the embodiment of FIG. 10 including the application of a planarizing layer and metal pads.

The next steps are shown in FIG. 11. A planarizing layer of nonconductive material 128 may be applied to the wafer in order to fill all the gaps between the mesas and provide a surface level with the tops of the metal caps 124 on the mesas. This may typically be done with spin deposition of a polymer like polyimide or bisbenzocyclobutene (BCB) or with a spin-on glass (sol-gel) formulation. Careful control of the parameters allows for the applied layer to match the height of the mesas. Additional solvent removal or mechanical polishing may be used to exactly match the height of the mesas. Other deposition processes may also be used to create the planar surface.

The two types of mesa, 103 and 105, may be slightly different heights, due to the removal of layers 114 and 116 from the active mesas 103. The height difference may be small enough that the planarization step can provide a sufficiently uniform contact pad surface 130 for soldering purposes.

Once the planarizing material is hardened or cured, a photolithographic pattern process may be completed to pattern interposer metal pads 130 that contact the metal caps. These pads can be much larger than the mesas and separately provide electrical contact to groups of active mesas or individual active mesas to form the anode pads and to groups of shorted mesas or individual shorted mesas to form cathode pads. The pad shapes and spacing may provide great flexibility in how the mesas are interconnected. The pad metal may be gold or a layered structure optimized for heat dissipation and high electrical conductivity. An example is a thin gold layer to contact the tops of the metal caps (also gold in this example) and then a thick layer of plated copper to provide high lateral conductivity and heat transfer. The effect of the pads 130 is to provide an interposer layer to allow the final solder bumps to be on a significantly different pitch and size than the mesas. The additional surface area and thermal mass can greatly increase the thermal dissipation of the VCSEL array compared to the metal heatsink caps 124 by themselves.

Figure 12:
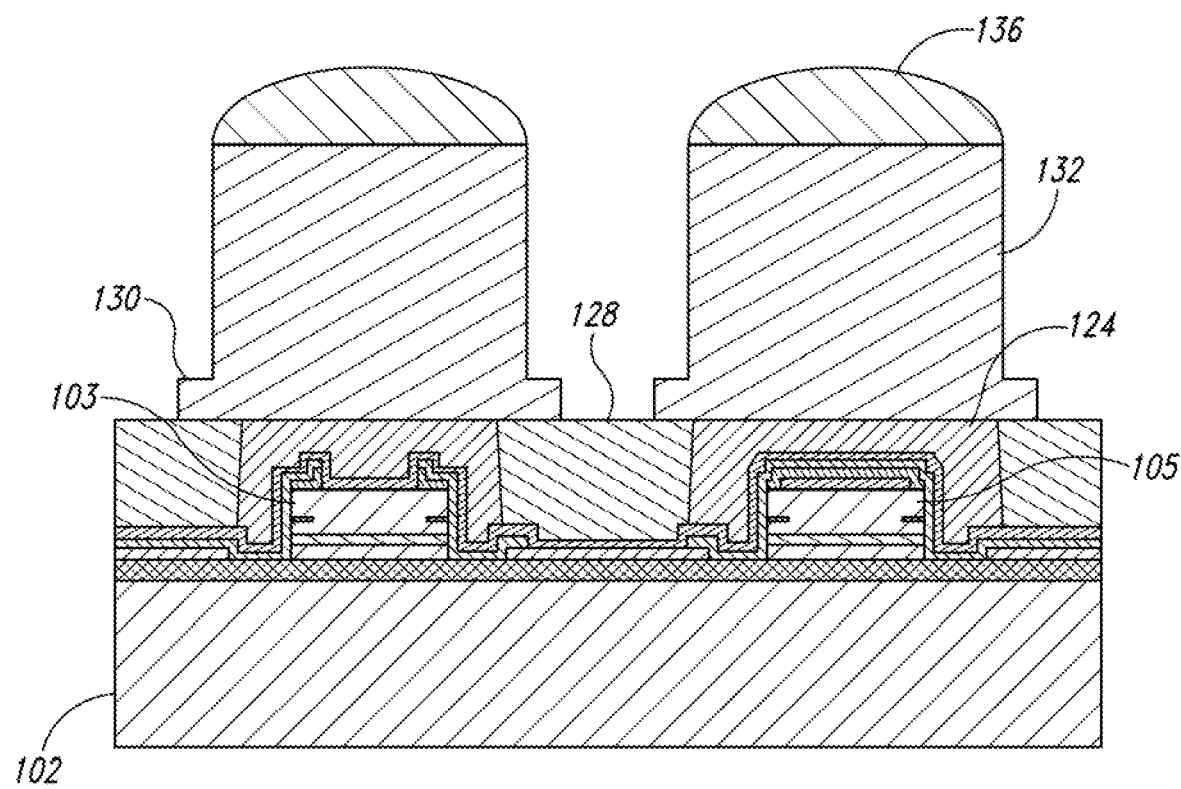
FIG. 12 illustrates the continued formation of the embodiment of FIG. 11 including the addition of metal structures over the interposer metal pads added in FIG. 11.

The pattern of the pad metal 130 may not be the best layout for compatibility with surface mount processes and may therefore be somewhat arbitrary in size and shape, in order to accommodate the patterns of mesas that need to be connected together, due to the functional, optical and electrical requirements for the VCSEL array. In order to provide a uniform array of contact pads ideally configured for soldering to PCB solder pads with automated assembly and solder reflow methods an additional metal structure of metal pads, posts, pillars or bumps 132 may be fabricated on the interposer pads 130. In FIG. 12, the metal pads, posts, pillars or bumps 132 are depicted as much thicker and larger than the VCSEL mesas, but may be smaller and may be patterned more densely, depending on the manufacturing processes available. The key point is that they provide for good mechanical and metallurgical bonding to the PCB solder pads and can be located on the underlying pad metal 130 so that they match up to the PCB solder pad dimensions and spacing. This allows separate optimization of the VCSEL array dimensions and spacing from the electrical contact functions of the device.

FIG. 12 illustrates the resulting metal structures according to a first embodiment, a combination of posts 132 and solder metal layer 136 that may provide the actual solder bonding surfaces for the VCSEL array. Copper electroplating of the posts 132 provides a thick structure that can carry large amounts of current with very low loss and low parasitic inductance. The copper posts may be terminated with a metal layer structure optimized for good adhesion and compatibility with common solders used for surface mount assembly. An example is a layer of gold on the surface of the copper posts 132 with a diffusion barrier of nickel followed by a thin corrosion barrier of gold. There are many variations of commonly used under bump metallization (UBM) known to those skilled in the art. The fabrication of the copper posts may require another application of a continuous thin metal seed layer, a thick photoresist layer photolithographically patterned to create the desired size and pitch of copper posts.

After electroplating, and possibly replanarizing by chemo-mechanical polishing methods, the photoresist may be stripped, and any seed metal layer stripped away. FIG. 12 shows an optional additional solder metal layer 136 on the top of the metal posts. This layer 136 may be deposited electrochemically after the other metals in the post structure, or may be applied afterwards by other deposition methods, including evaporation, electroplating, jet deposition or mechanical application of discrete solder balls.

Figure 13:
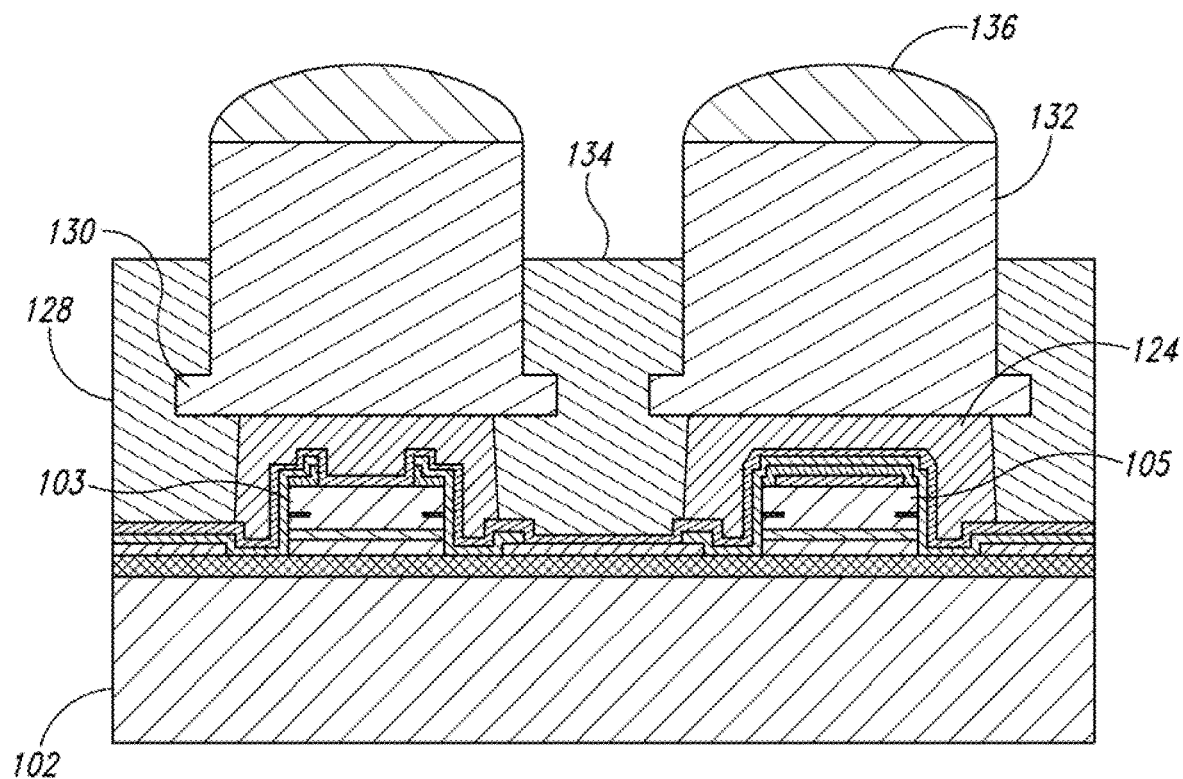
FIG. 13 illustrates another embodiment to that shown in FIG. 12.

A second embodiment is shown in FIG. 13 in which an additional planarization layer 134 of polymer or other dielectric material is applied after the completion of the interposer metal pads 130. This layer can also be patterned and used to define the shapes of the metal posts 132, but may be left in place to insulate the interposer pads from the deposition of the solder 136 and from the soldering reflow process itself. The additional planarization dielectric 134 can also be left higher than the metal posts 132 to facilitate the assembly of discrete solder balls onto the metal post 132 surfaces.

Figure 14:
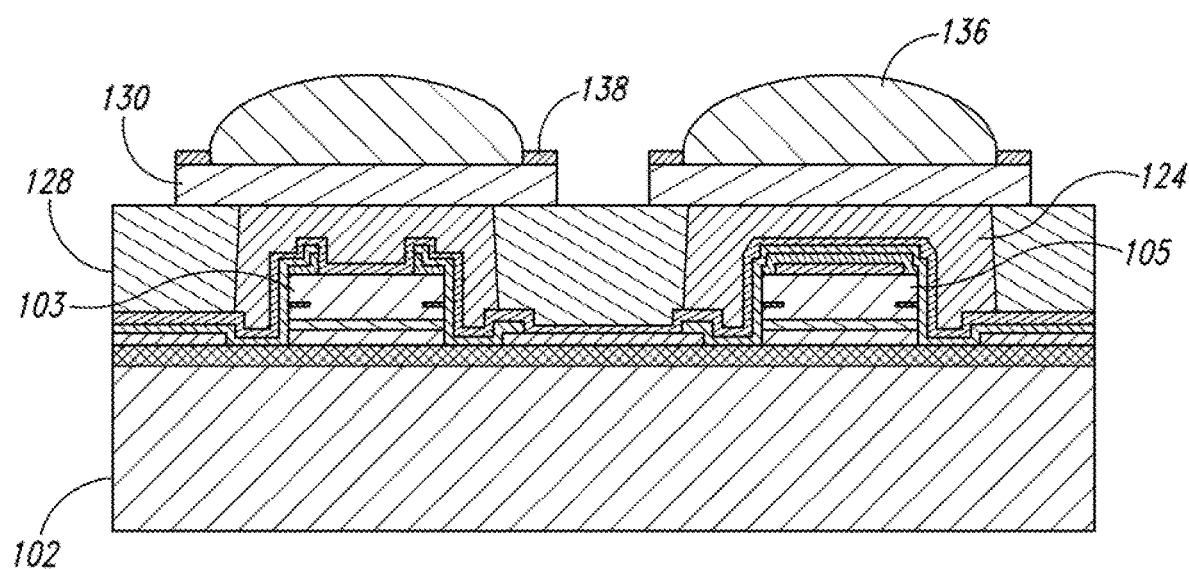
FIG. 14 illustrates a further embodiment to that shown in FIG. 12.

Another embodiment, shown in FIG. 14, does not use the plated copper posts, but uses a solder wetting barrier 138 directly on the anode and cathode pad metal 130 so that specific areas of the pad can have solder deposited or can be bonded with solder paste applied to the PCB. The solder wetting barriers can be dielectric material or metals known to those skilled in the art to not allow wetting by solders used for attachment to the PCB.

Figure 15:
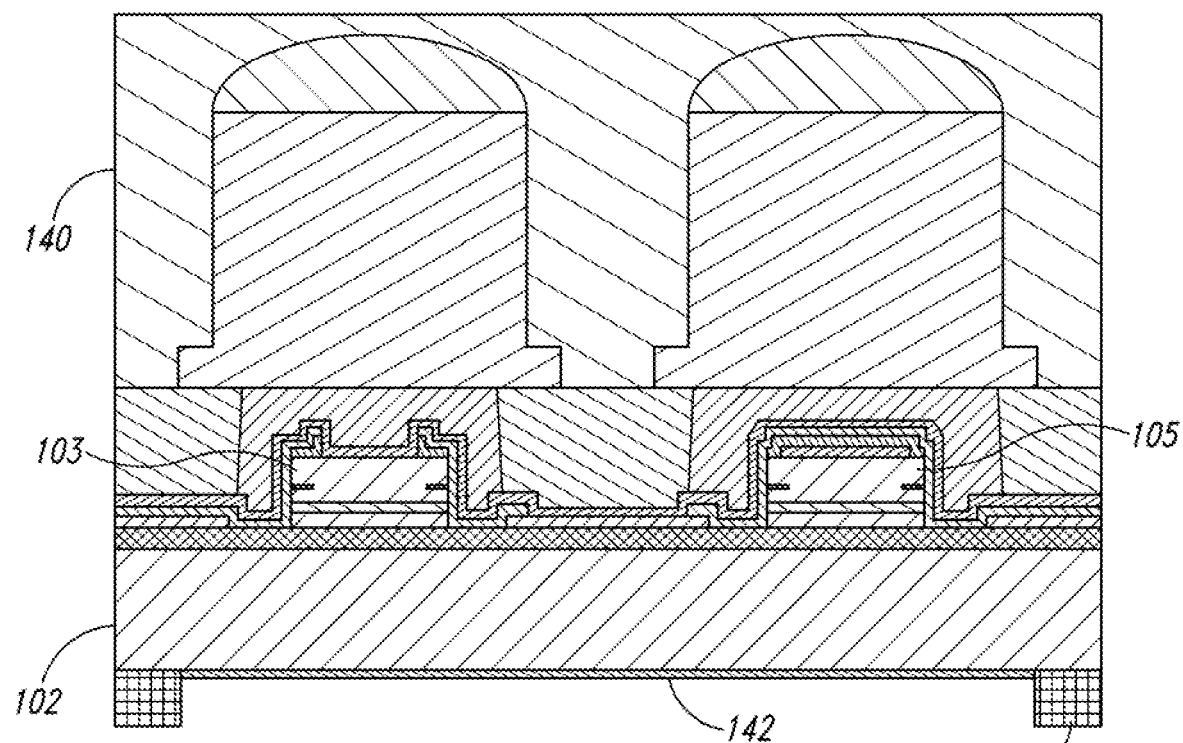
FIG. 15 illustrates the continued formation of the embodiment of FIG. 12 including the application of a protective resin layer on the active side and an anti-reflective coating and standoff structures on the back side in the embodiment.

As embodiments of the VCSEL array design disclosed herein is for devices that will emit light through the surface of the substrate 102, additional process steps may typically be needed for the other side of the wafer. At this point the side of the wafer with the mesas (the "active side") may need to be protected while processing is performed on the other side (the "back side") of the substrate wafer. One approach illustrated in FIG. 15 may be to encapsulate the exposed metal posts and the gaps between the posts in a removable resin 140, such as photoresist or a wax or resin that can be applied uniformly and easily removed by solvents. A mechanical "handle" wafer (not shown), such as a silicon or quartz wafer may then be bonded to the surface of the resin 140 for additional mechanical support during the processing of the back side of the wafer. FIG. 15 shows the device structure with the resin encapsulation 140 in place and the substrate thinned by mechanical and chemo-mechanical means. The back side of the substrate is also polished for low scattering loss. An anti-reflection (AR) coating 142 can also be applied to reduce Fresnel reflection losses from the substrate surface. The AR coating can also be photolithographically patterned by an etch or liftoff process to provide labeling information as the light emission surface will be the surface visible after assembly.

Figure 16:
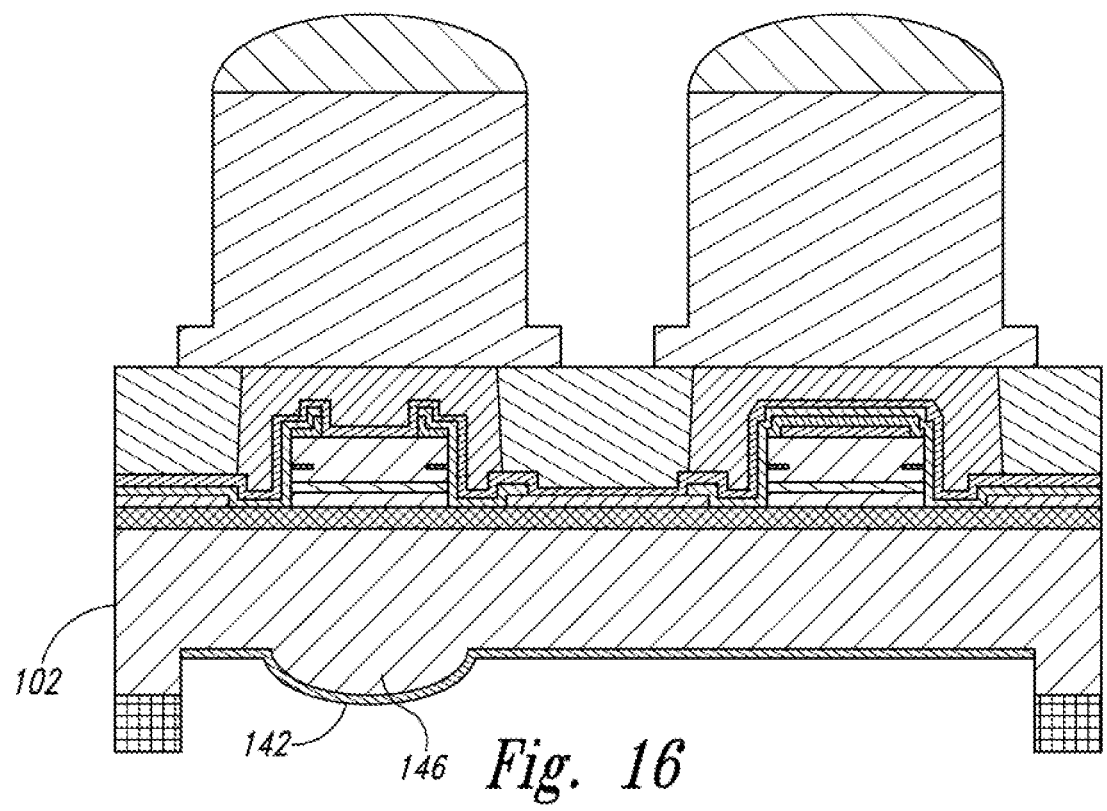
FIG. 16 illustrates the continued formation of the embodiment of FIG. 12 having an integrated microlens etched into the back side.

A standoff structure in metal or a durable heat-resistant polymer material 144 can be applied to the back side of the wafer to provide protection of the AR coated surfaces during handling and assembly. The completed device, after removal of the any handle wafer and the encapsulating resin 140 is as shown in FIG. 16. The resulting finished wafer can then be diced, and each individual die can be a completely packaged part with solder pads large enough in size and pitch to be soldered directly to a PCB by standard assembly techniques.

The backside or emission side of the wafer can also be used to fabricate optical structures, including microlenses, for control of beam direction and beam properties of the lasers. FIG. 16 further illustrates an example of a microlens 146 etched into the substrate for this purpose. This step can be done right after the wafer thinning step so that an AR coating 142 can then be applied to the lens surface. There are numerous processes for fabricating microlenses on the surface of the array that are known to those skilled in the art, including reflow of polymers, transfer etching of a resist profile formed by grayscale lithography or reflow of a resist. Diffractive structures including gratings, Fresnel lenses, kinoforms and computer-generated phase relief holograms may also be fabricated on the back side of the wafer for control and manipulation of the output beams of the VCSELs.

Figure 17:
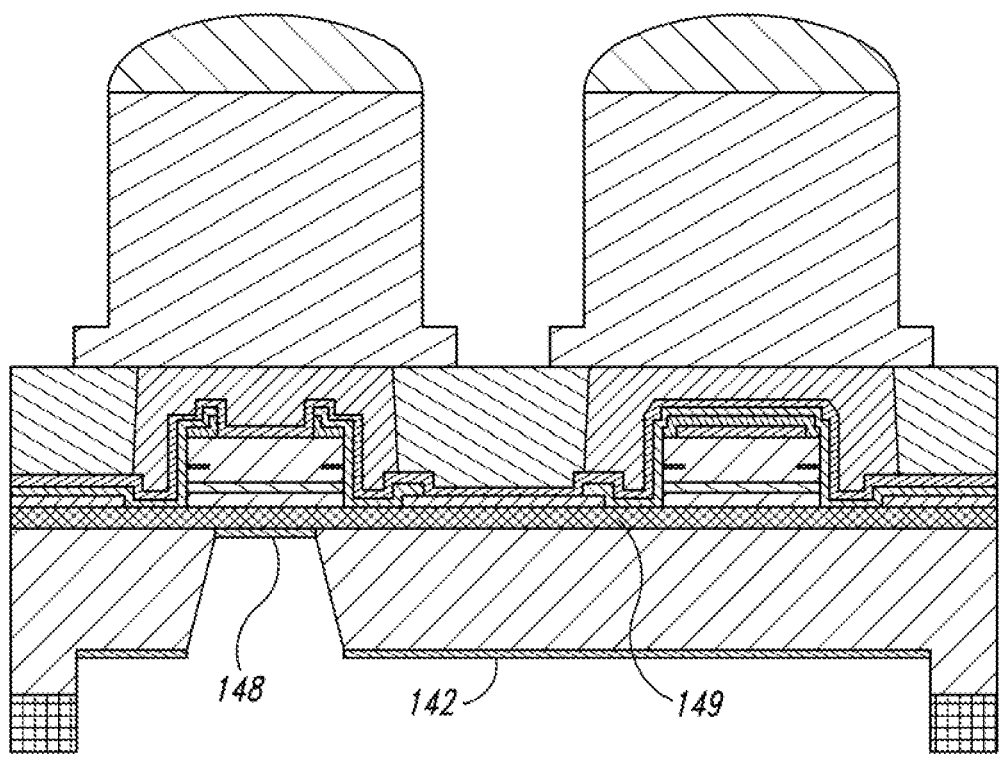
FIG. 17 illustrates an alternative embodiment of the finished wafer of FIG. 16 where the microlens on the back side has been replaced with a via removing substrate material down to the epitaxial layers, over which an AR coating is applied.

In some cases, the wavelength of the VCSELs will be designed to be short enough that the semiconductor substrate 102 is absorbing at the operating wavelength, resulting in unacceptable light emission losses even when the substrate is thinned. FIG. 17 shows a variation of the VCSEL array of FIG. 16 in which the processing on the back (or emission) side of the wafer includes etching of vias 148, in place of microlens 146, so as to remove all substrate material in the beam path. This process may be enabled by including a suitable selective etch stop layer, known to those skilled in the art, in the epitaxial growth structure 149 at the interface of the lower DBR 104 and the substrate 102. The via may then be patterned in photoresist on the backside of the wafer and a selective wet or dry etch may be used that will stop at the layer that greatly slows the etch process. An AR coating 142 may be applied to the exposed epitaxial layers 149 as well as the remaining substrate.

Figure 18:
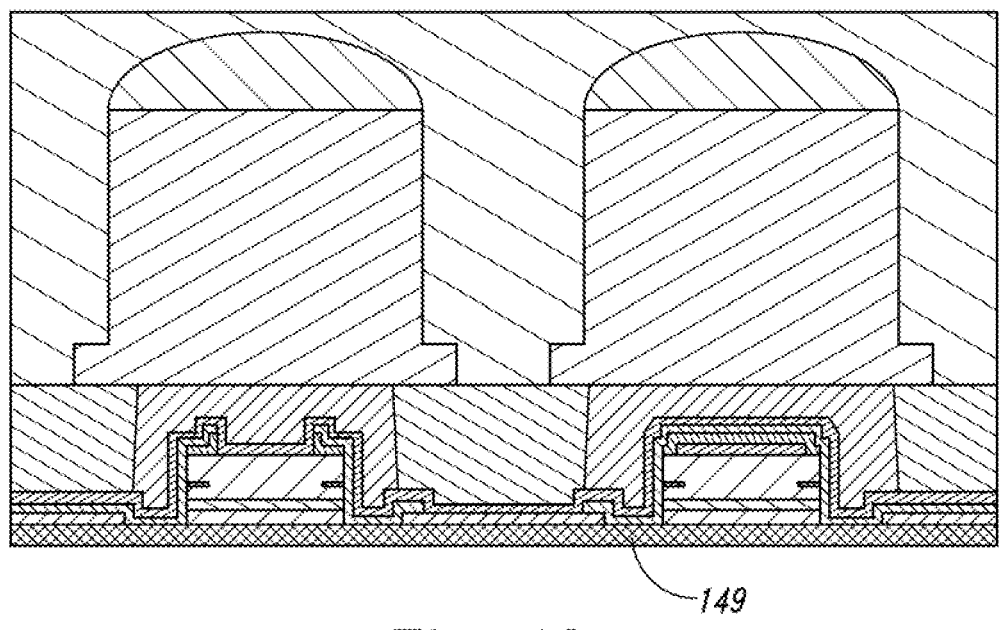
FIG. 18 illustrates an alternative embodiment that includes a resin encapsulation on the active side with the entire substrate removed from the back side.
Figure 19:
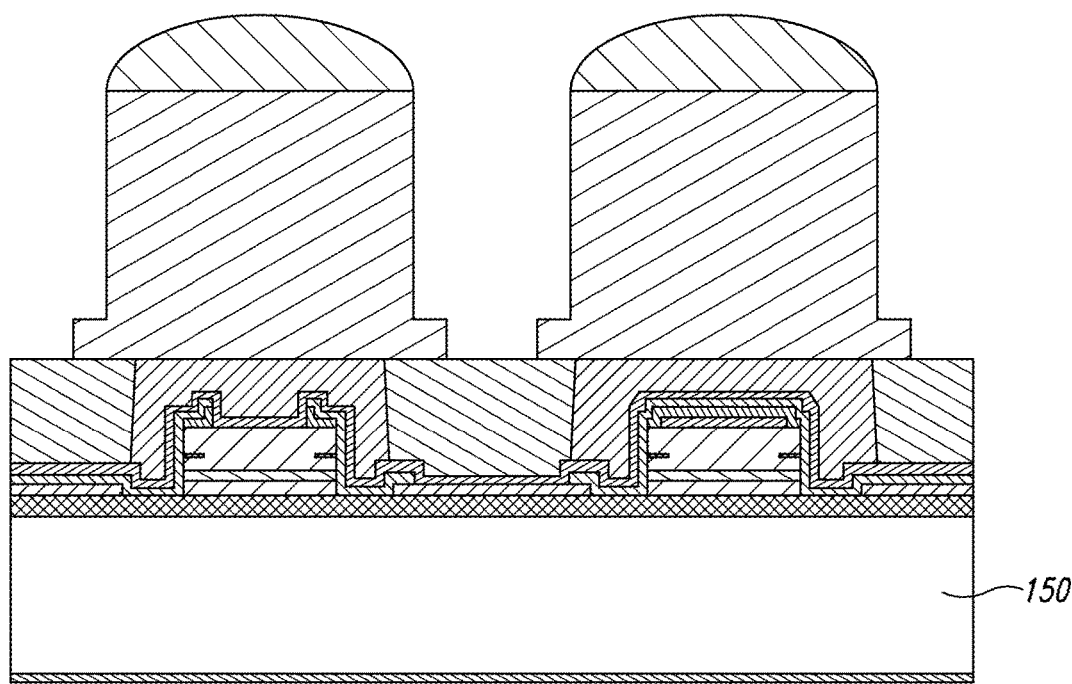
FIG. 19 illustrates an embodiment in which a transparent support wafer has been applied to the backside over the exposed surface of the epitaxial layers.

In other cases, it may be desirable to remove the substrate entirely from the wafer while it is still attached to a handle wafer, as discussed in reference to FIG. 15. When that is done, the extremely thin epitaxial layers 149 that make up the VCSEL array and the added metal and planarization layers would be all that was left, as shown in FIG. 18. A new support wafer 150 that is transparent to the laser wavelength may then be bonded to the exposed surface 149 as shown in FIG. 19. The exposed semiconductor surface 149 or the surface of the transparent wafer can have an antireflection matching coating to minimize reflections between the two material that are likely to have a large index mismatch and high reflection losses. The emission side of the transparent wafer 150 can also have an AR coating 142, as well as microlenses, other micro-optical devices, and protective standoff frames similar to those described above.

The transparent wafer 150 may have a high reflectivity coating on the surface so that it forms an extended cavity of the lasers for larger mode volume devices with higher power and improved brightness. This type of device is commonly referred to as a VECSEL. The transparent wafer 150 may also be a doped glass or crystalline laser gain medium with appropriate coating to make a diode-pumped solid-state laser array where the VCSEL laser elements are the pump lasers.

Figure 20:
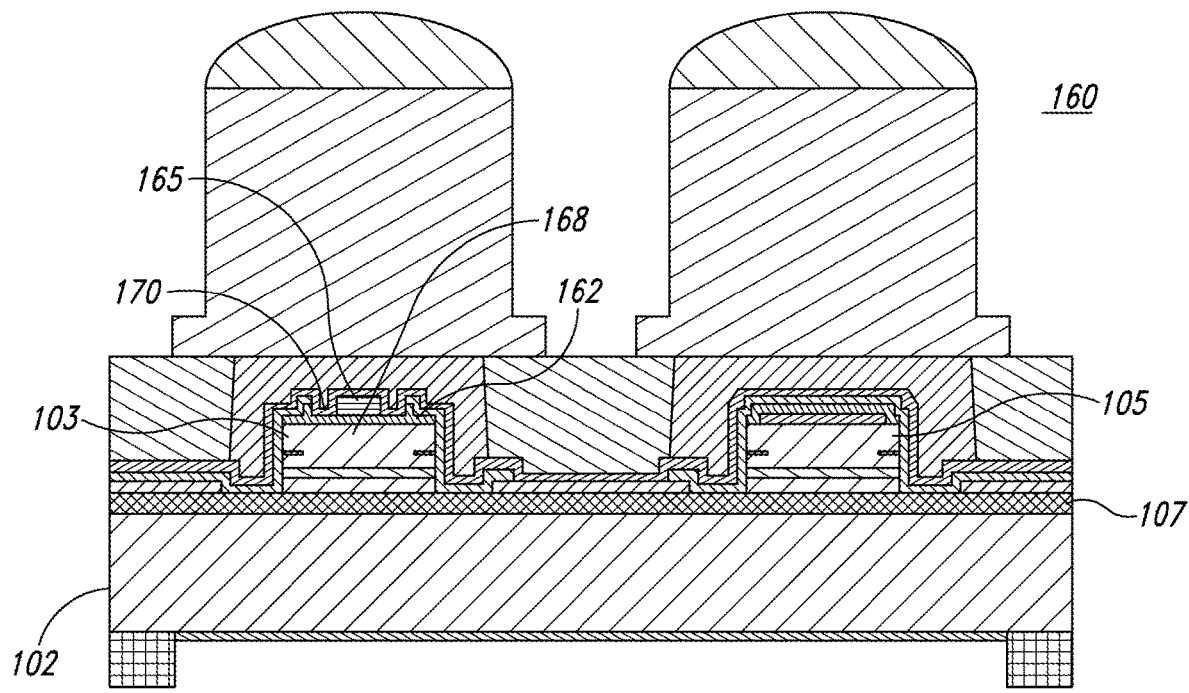
FIG. 20 illustrates an embodiment in which part or all of the upper DBR is replaced by a mirror formed within an addition intercavity contact layer.

Another alternative embodiment is shown in FIG. 20. In this embodiment, device 160 includes a second intracavity contact layer 162 that may be grown in the upper DBR structure. The upper DBR structure may be many fewer layers than in other embodiments or omitted completely, depending on the detailed laser design and replaced by a spacer layer and a doped contact layer configured to support the growth of a sequence of dielectric layers on top. The second intracavity contact layer 162 may be a heavily doped semiconductor layer that facilitates high lateral conductivity and provides a good ohmic metallic contact. Instead of a full upper DBR fabricated of epitaxial semiconductor alloys, as used in other embodiments, a separate mirror 165 may be deposited after the formation of a metal contact, such as an annular ohmic contact 170, on the upper intracavity contact layer 162. The annular ohmic contact 170 (shown in FIG. 22) has an opening large enough for the planned laser aperture or a resonant LED if used for that purpose. The mirror 165 may be a dielectric stack of contrasting index of refraction materials commonly used by those skilled in the art of making high reflectivity, low loss laser mirrors. The dielectric mirror 165 may be designed for phase matching to the partial upper DBR layers 168 if they are used. The mirror 165 does not conduct current. The upper intracavity contact layer 162 conducts the current from the annular ohmic contact 170. One advantage of this type of device is that the semiconductor-based DBR layers can be inefficient for longer wavelength lasers designs. This design approach also reduces ohmic losses as the current does not have to go through the full thickness of semiconductor DBR layers.

Figure 21:
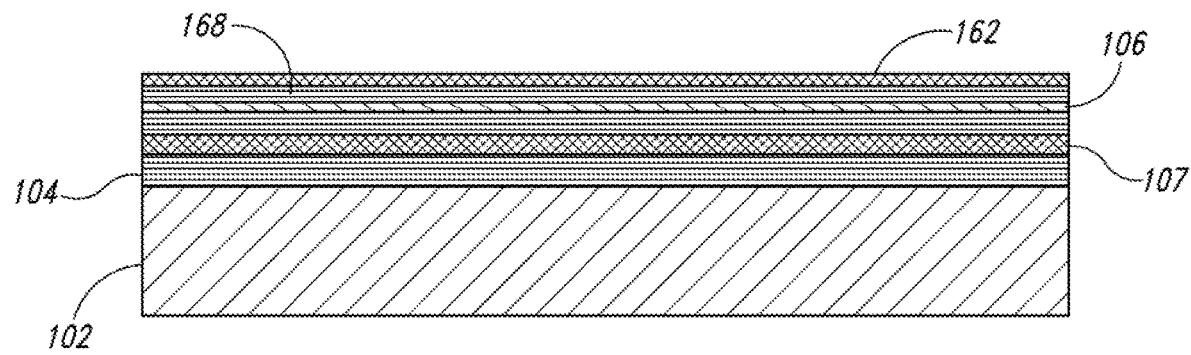
FIG. 21 illustrates, in greater detail, the initial formation of the wafer structure of FIG. 20.
Figure 22:
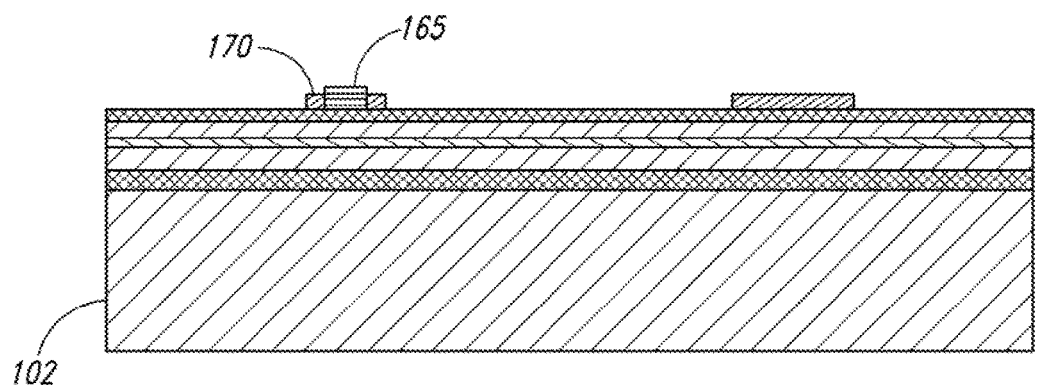
FIG. 22 illustrates the continued formation of the wafer structure of FIG. 21.
Figure 23:
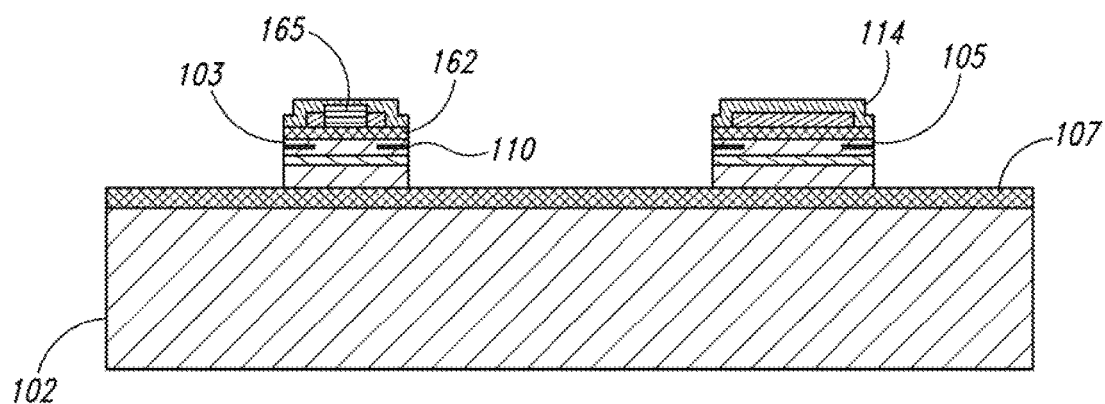
FIG. 23 illustrates the continued formation of the wafer structure of FIG. 22.

FIG. 21 shows in greater detail the epitaxial wafer structure of FIG. 20 having the second intracavity contact layer 162 as well as the lower intracavity contact layer 107 and a reduced thickness top DBR layer structure 168. FIG. 22 shows the same device structure after deposition and patterning of the annular metal layer 170, which makes an ohmic contact to the top intracavity contact layer 162. As shown in FIG. 23, the laser mesa 103 in this case has the contact metal 170 patterned with an opening in the center of the mesa 103. The mirror layers 165 are deposited over the ohmic contact 170 so that the opening is filled with the dielectric layers to create a high reflectivity laser cavity. The size of the final mirror, which may be a hybrid mirror combining the dielectric mirror layers with a partial upper DBR, needs to be large enough relative to the laser aperture formed by the oxidation of the high aluminum content layers 110 (shown in FIG. 7) or by ion implant. In FIG. 23 the laser mesa 103 and the shorted or grounded mesa 105 are formed as described earlier. At this stage, fabrication of the completed device may be substantially the same as described above, provided care is taken to protect the mirror layers 165 during the process steps.

Figure 24:
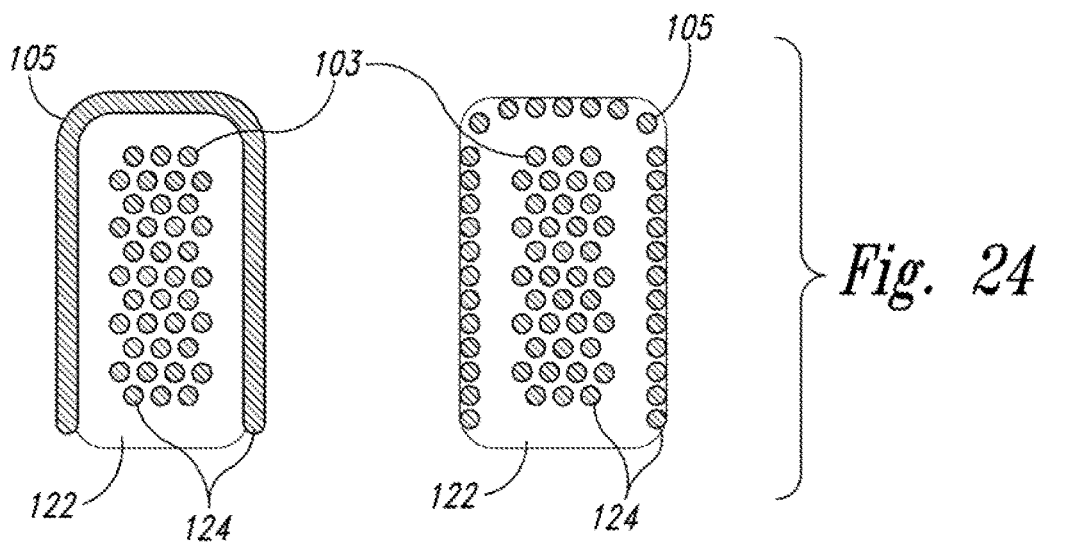
FIG. 24 illustrates embodiments of two exemplary layouts for VCSEL arrays.
Figure 25:
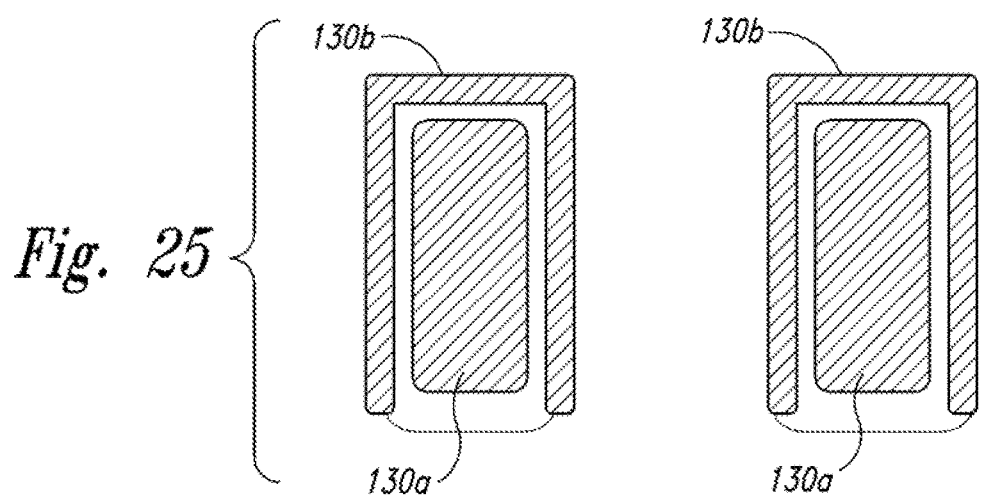
FIG. 25 illustrates the interposer pad metal patterns for the layouts of FIG. 24.
Figure 26:
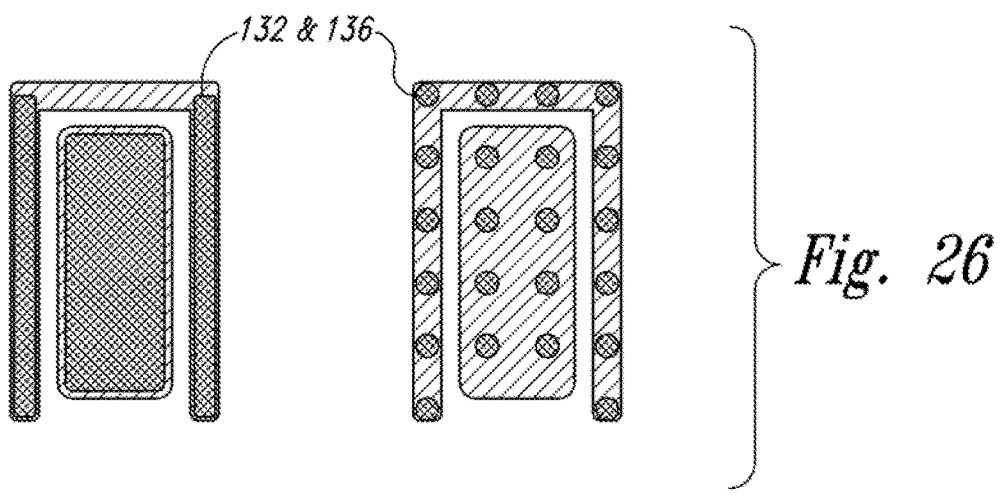
FIG. 26 illustrates the contact pads or bumps for the layouts of FIG. 24.

In accordance with an embodiment, FIGS. 24-26 illustrate top views of two exemplary layouts for a VCSEL array following the processes illustrated in FIGS. 10-12. Active laser mesas 103 are grouped in the middle area, surrounded by n-contact metal 122, which is ringed by shorted mesas 105. FIG. 24 illustrates the sequence of capped mesas 124 formed by completion of the process illustrated in FIG. 10. FIG. 25 illustrates the interposer pad metal 130 added as a result of the process illustrated in FIG. 11. FIG. 26 illustrates the solder bumps 136 added to the tops of the metal posts 132 in FIG. 12. As illustrated in FIG. 25, for both layouts, interposer pad metal pattern 130a connects all of the active laser mesas 103 in parallel while the other interposer pad metal pattern 130b connects all the shorted mesas 105 together. In this embodiment, the metal posts 132 for pad metal pattern 130a are the anode contacts of the device and the metal posts 132 for pad metal pattern 130b are the cathode contacts of the device. Note: as illustrated in the left layout of FIG. 26, the metal posts 132 do not have to be cylindrical structures as in the example in FIGS. 12-20. The shape of the metal contact posts may be designed for optimum solder contact area for ease of assembly, high thermal conduction into the PCB metal, strong mechanical solder bond strength and high conductivity and low inductance.

Figure 27:
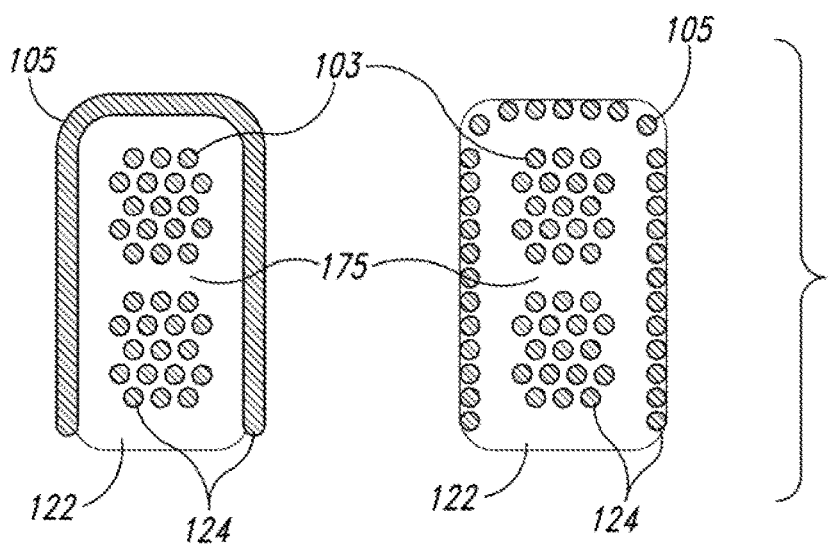
FIG. 27 illustrates another embodiment of an exemplary layout grouping for VCSELs.
Figure 28:
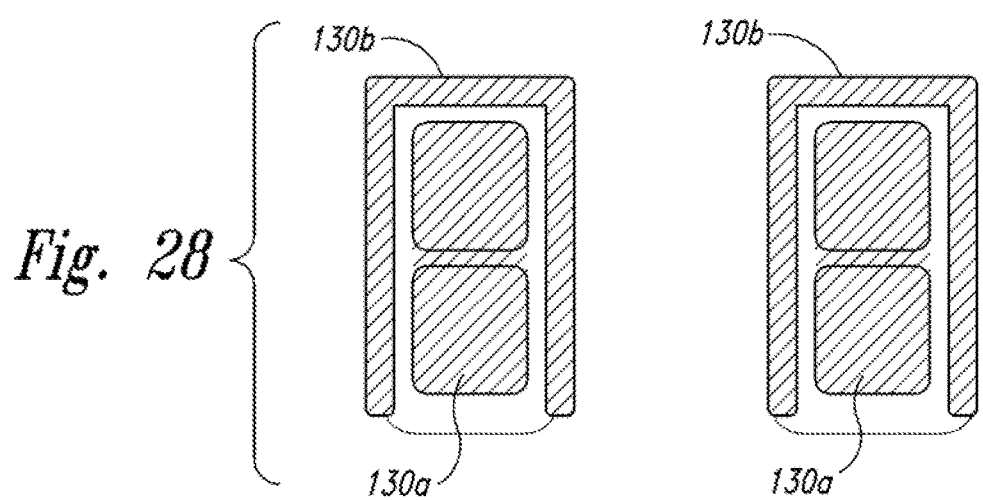
FIG. 28 illustrates the interpose pad metal patterns for the layouts of FIG. 27.
Figure 29:
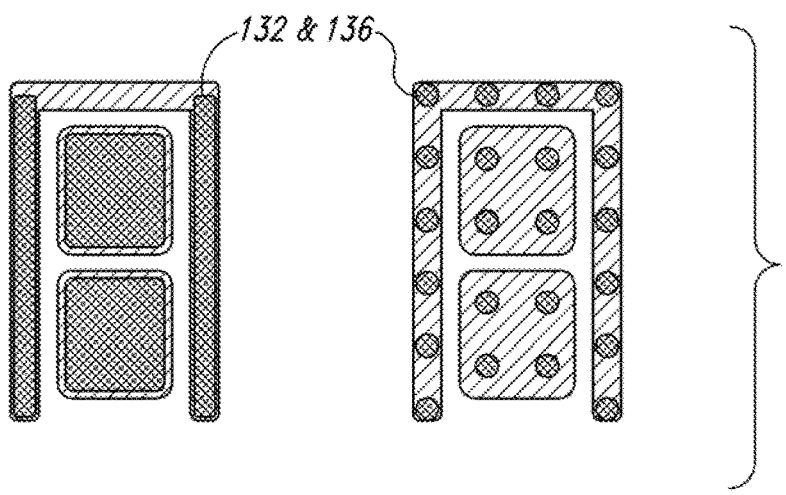
FIG. 29 illustrates the contact pads or bumps for the layouts of FIG. 27.

FIG. 27 illustrates another exemplary layout for a VCSEL array. As shown in FIG. 27, the capped mesas 124 are configured similarly to the configurations of FIG. 24, but the active laser mesas 103 may be separated into two groups by a gap 175. Likewise, the interposer pad metal 130a may be separated into two areas for the VCSELs (active mesas) 103, as shown in FIG. 28. In this case the shorted mesas 105 are still all contacted in parallel for a low impedance current return path and because the VCSELs all share common ground connection through the intracavity contact layer in the lower DBR 108. The metal contact posts 132 illustrated in FIG. 29 are also now separately connected into contact pads for soldering the device to a PCB, each connecting to a group of VCSELs (active mesas), 103.

Separation of the active mesas (VCSELs) in this manner makes it possible to independently turn on and off the groups of VCSELs and allows for the groups of VCSELs to be independently modulated, such as by connecting the separate contacts through separate pads on the PCB. This is a very flexible embodiment for configuring a VCSEL array for specific applications through the final fabrication steps. The layout of the mesas 103 and 105 can be on a fixed pitch that is optimized for efficient current spreading through the array and for balanced heat load across the array and the final electrical configuration decided by the design of the interposer pad metal 130 pattern and the metal contact post 132 pattern.

Flexibility in the design of the contact pad layout 130 is limited by the fact that in the fabrication sequence depicted thus far the VCSELs are all connected in common through the intracavity contact layer. This contact layer, however, can be altered in the fabrication sequence by an additional trench etch or isolation implant so that groups of VCSELs (active mesas) 103 are isolated from each other. In such an embodiment, it is desirable to have an undoped semiconductor substrate 102 so that only the intracavity contact layer and any doped layers in the lower DBR 104 need to be made nonconducting in regions to separate the groups of VCSELs electrically. This may be accomplished by ion implantation into areas of the conductive layers so that the disordering of the implant renders those area nonconducting. Another approach is to do a second etch step after the mesa etch to physically isolate the regions from each other by etching through the intracavity contact layer and a remaining doped lower DBR layers.

Figure 30:
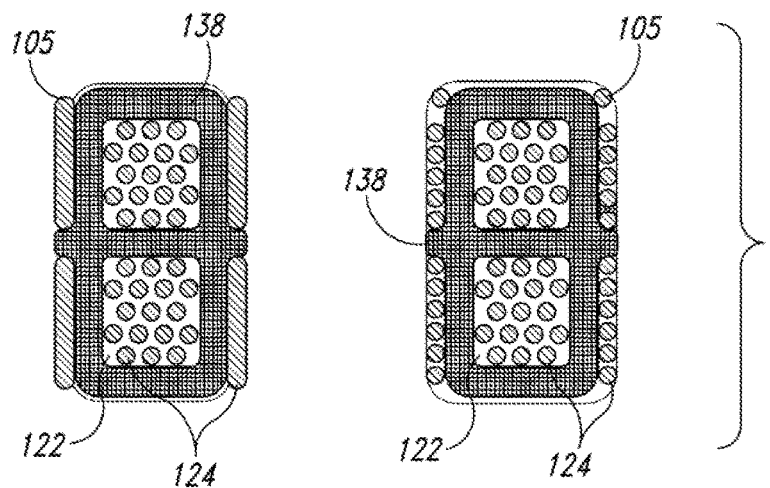
FIG. 30 illustrates another embodiment of an exemplary layout grouping for VCSELs with the addition of non-conducting regions.
Figure 31:
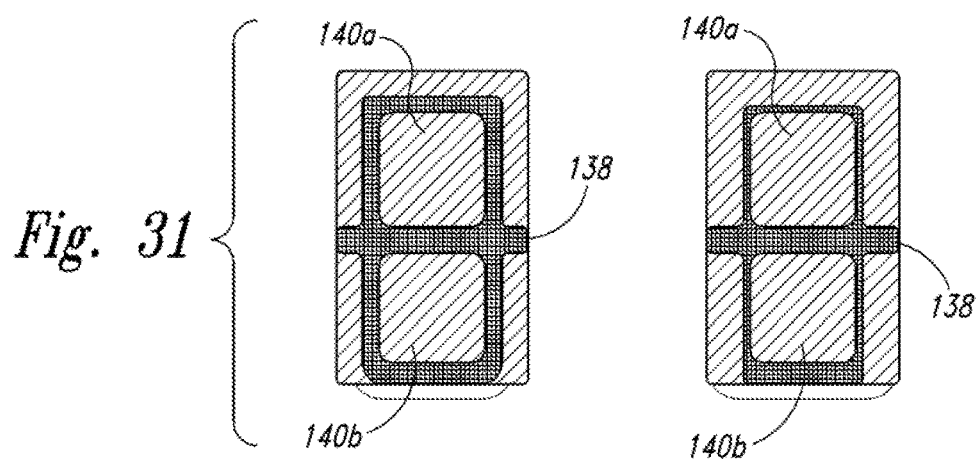
FIG. 31 illustrates the interposer pad metal patterns for the layouts of FIG. 27.
Figure 32:
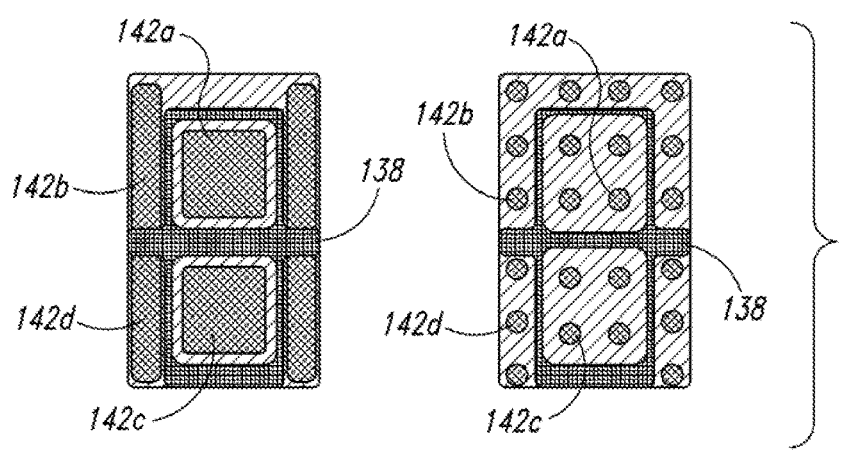
FIG. 32 illustrates the posts and solder bumps for the layouts of FIG. 27.

FIG. 30 shows a top view of a VCSEL array in which an additional ion implant is used after the mesa etch step to render non-conducting regions 138 of the intracavity contact layer, and to make the lower DBR 104 nonconducting. The groups of VCSEL mesas and shorted mesas shown are now electrically isolated from each other. As shown in FIG. 31, the interposer pad metal 140a and 140b are also electrically separated. FIG. 32 shows the metal contact post and solder areas 142a, 142b, 142c and 142d that may make contact to separate PCB solder pads so that the cathode contacts of one part, for example anode contact 142a, can be connected to the current supply through the PCB board. The cathode contacts 142b then are connected to the anode contacts 142c of the second group. The current flow then returns to ground through cathode contacts 142d. The result is to connect the two groups of lasers in series through the PCB connections.

It is possible to connect the cathode contacts 142b to the anode contacts 142c on the die itself, so that only contacts 142a and 142d need to be connected to the power and ground contacts on the PCB and the two regions of the die are connected in series. However, in the preferred embodiment as shown in FIG. 32, the contact pads 142a, and 142b are isolated from contact pads 142c and 142d by the non-conducting region 138 so that the PCB designer can connect the two laser regions (142a and 142c) in parallel or in series as preferred by the designer.

The embodiments of the present disclosure, while illustrated and described in terms of various embodiments, are not limited to the particular descriptions contained in the specification. Different materials and different combinations of elements may be used in a manner consistent with the present disclosure to develop additional embodiments. Additional alternative or equivalent components and elements may also be readily used to practice the present disclosure.

What is claimed is:

1. An array of vertical-cavity surface-emitting lasers or other semiconductor light-emitting devices on a single semiconductor die, comprising:
   a first distributed Bragg reflector (DBR) including an intracavity contact layer, the intracavity contact layer configured to allow lateral conduction across a semiconductor wafer;
   a second DBR and p-n junction gain regions between the first DBR and the second DBR;
   a plurality of mesas fabricated by etching layers through the second DBR, the p-n junction gain regions, and a portion of the first DBR to the intracavity contact layer so that the p-n junction regions of the mesas are separated and the intracavity contact layer is exposed for making electrical contact to a surface of the intracavity contact layer, wherein the plurality of mesas include shorted mesas and laser mesas;
   a metallic contact deposited on the intracavity contact layer configured to conduct current laterally from near each of the laser mesas to connect to the shorted mesas to reduce current spreading loss in the intracavity contact layer;
   each laser mesa including a first ohmic contact at a top of a laser mesa structure and being insulated on sides of the laser mesa structure by a dielectric layer that prevents shorting of each p-n junction gain region of each laser mesa so that current flows through each p-n junction gain region of each laser mesa to emit light;
   a first thick metal coating applied over the first ohmic contact and insulated sides of each laser mesa structure to provide protection from corrosion and additional heat sinking and to form an anode contact to each laser mesa;
   each shorted mesa including a second ohmic contact at a top of a shorted mesa structure and being insulated over the second ohmic contact and sides of the shorted mesa structure; and
   a second thick metal coating applied over the insulated second ohmic contact and insulated sides of each shorted mesa structure to provide an electrical connection between each shorted mesa and the intracavity contact layer so that current is shunted past each p-n junction gain region and to form cathode contacts to the shorted mesas through the intracavity contact layer;
   wherein the first thick metal coating over the laser mesas and the second thick metal coating over the shorted mesas allow the anode contact of each laser mesa and the cathode contacts of the shorted mesas to be made on one side of the semiconductor wafer with light emission from an opposite side of the semiconductor wafer;
   wherein the one side of the semiconductor wafer is subject to a planarization process using a deposited insulating material and provided with two or more patterned metal pads, a first patterned metal pad providing a first planar electrical interconnection between the cathode contacts of two or more of the shorted mesas and a second patterned metal pad providing a second planar electrical interconnection for the anode contact of one or more of the laser mesas, the first planar electrical interconnect being separate from the second planar interconnection; and wherein the one side of the semiconductor wafer, after singulation of the semiconductor die from the semiconductor wafer, is configured to be directly soldered to a printed circuit board as a surface-mount component with no additional packaging needed.

2. The array of claim 1, further comprising a trench or implanted region or a combination thereof to electrically isolate one or more of the laser mesas and one or more of the shorted mesas from the other mesas among the plurality of mesas by rendering an area of the intracavity contact layer nonconducting, and wherein the two or more patterned metal pads are patterned after planarization so the isolated mesas can be separately electrically contacted through metallic posts or bumps from the printed circuit board.

3. The array of claim 1, wherein the semiconductor wafer includes a mechanically or chemically thinned substrate and an anti-reflection coating.

4. The array of claim 1, wherein the semiconductor wafer includes a substrate including lenses etched into the substrate in alignment with the laser mesas so that light beam properties of each laser mesa can be altered through selection of a lens profile and an offset for each lens, wherein the offset alters an alignment of each lens from a laser axis of a corresponding laser mesa.

5. The array of claim 1, wherein the semiconductor wafer includes a substrate including a diffractive optical element etched into the substrate in alignment with the laser mesas so that light beam properties of each laser mesa can be altered by the diffractive optical element, wherein the light beam properties include divergence, shape and direction.

6. The array of claim 1, wherein the semiconductor wafer includes a substrate including vias etched in the substrate that are aligned to apertures of the laser mesas so that substrate absorption is reduced for low loss operation at wavelengths that would be absorbed by the substrate during laser transmission.

7. The array of claim 1, wherein the semiconductor wafer includes a substrate that is removed by mechanical and chemical means and replaced with a transparent support substrate that can be bonded for mechanical support.

8. The array of claim 1, wherein the semiconductor wafer includes a substrate that is removed by mechanical and chemical means and replaced with a transparent support substrate including lenses or other diffractive surfaces aligned with the laser mesas so that light beam properties can be altered, the light beam properties including one or more of divergence, shape and direction.

9. The array of claim 1, wherein the semiconductor wafer includes a substrate that is removed by mechanical and chemical means and replaced with a transparent support substrate including reflective coatings that can be bonded to the surface of the intracavity contact layer to provide an external laser cavity for each laser mesa.

10. The array of claim 1, wherein the semiconductor wafer includes a substrate that is removed by mechanical and chemical means and replaced with a transparent support substrate including convex or concave lens surfaces and reflective coatings that can be bonded to the surface of the intracavity contact layer to provide an external laser cavity for each laser mesa.

11. The array of claim 1, wherein the semiconductor wafer includes a substrate that is removed by mechanical and chemical means and replaced with a replacement support substrate that includes a glass or crystal solid state laser gain medium with reflective coatings that can be bonded to the surface of the intracavity contact layer to provide a VCSEL-pumped solid state laser array.

12. The array of claim 1, further comprising conductive metal pads, posts or bumps provided as electrical contacts on the two or more patterned metal pads, wherein the two or more patterned metal pads have a size, a pitch and a height so that conventional printed circuit fabrication techniques can use the conductive metal pads, posts or bumps as solder pads.

13. The array of claim 12, further comprising an under-bump metallization on one or more of each anode contact and the cathode contacts to prevent intermetallic diffusion and solder pre-tinned to surfaces of one or more of each anode contact and the cathode contacts.

14. The array of claim 12, further comprising an under-bump metallization on one or more of each anode contact and the cathode contacts to prevent intermetallic diffusion and solder balls pre-attached to one or more of each anode contact and the cathode contacts.

15. The array of claim 1, further comprising a second dielectric planarization layer applied to one or more of each anode contact and the cathode contacts to protect exposed sides of one or more of each anode contact and the cathode contacts or electrical connections thereto, to provide additional mechanical support, and to prevent contamination in spaces between one or more of each anode contact and the cathode contacts and the electrical connections thereto.

16. The array of claim 1, further comprising a solder-wetting barrier patterned on the one side of the semiconductor wafer to limit solder wetting to the two or more patterned metal pads, wherein the two or more patterned metal pads have a size, a pitch and a height so that conventional printed circuit fabrication techniques can use the two or more patterned metal pads as solder pads.

17. The array of claim 16, further comprising solder pre-tinned to surfaces of one or more of each anode contact and the cathode contacts.

18. The array of claim 16, further comprising solder balls pre-attached to one or more of each anode contact and the cathode contacts.

19. The array of claim 16, further comprising a trench or implanted region or a combination thereof to electrically isolate one or more of the laser mesas and one or more of the shorted mesas from other mesas among the plurality of mesas by rendering an area of the intracavity contact layer nonconducting, and wherein the two or more patterned metal pads are patterned after planarization so the isolated mesas can be separately electrically contacted by pads of the printed circuit board.

20. The array of claim 1, further comprising a protective metallic coating over at least the two or more patterned metal pads to prevent corrosion and to prevent diffusion from common solders.

21. An array of vertical-cavity surface-emitting lasers or other semiconductor light-emitting devices on a single semiconductor die, comprising:

a first distributed Bragg reflector (DBR) including a first intracavity contact layer, the first intracavity contact layer configured to allow lateral conduction across a semiconductor wafer;

a second intracavity contact layer and p-n junction gain regions between the first DBR and the second intracavity contact layer;

an annular ohmic contact patterned on the second intracavity contact layer, the annular ohmic contact having a central opening sized appropriate to not cause excess diffraction loss for a laser aperture;

a second DBR deposited on the annular ohmic contact so that the second DBR is in contact with the second intracavity contact layer exposed at the central opening of the ohmic annular contact;

a plurality of mesas fabricated by etching layers through the second DBR, the second intracavity contact layer, the p-n junction gain regions, and a portion of the first DBR to the first intracavity contact layer so that the p-n junction gain regions of the mesas are separated and the first intracavity contact layer is exposed for making electrical contact to a surface of the first intracavity contact layer, wherein a circumference of the second DBR is smaller than a circumference of the annular ohmic contact so the annular ohmic contact is exposed for electrical connection, wherein the plurality of mesas include shorted mesas and laser mesas;

a metallic contact deposited on the first intracavity contact layer configured to conduct current laterally from near each of the laser mesas to connect to the shorted mesas to reduce current spreading loss in the first intracavity contact layer;

each laser mesa being insulated on sides of a laser mesa structure by a dielectric layer that prevents shorting of each p-n junction gain region of each laser mesa so that current flows through each p-n junction gain region of each laser mesa to emit light;

a first thick metal coating applied over the second DBR and the annular ohmic contact and the insulated sides of each laser mesa structure to provide protection from corrosion and additional heat sinking and to form an anode contact to each laser mesa;

each shorted mesa including an ohmic contact at a top of a shorted mesa structure and being insulated over the ohmic contact and sides of the shorted mesa structure; and a second thick metal coating applied over the insulated ohmic contact and the insulated sides of each shorted mesa structure to provide an electrical connection between each shorted mesa and the first intracavity contact layer so that current is shunted past each p-n junction gain region and to form cathode contacts to the shorted mesas through the first intracavity contact layer;

wherein the first thick metal coating over the laser mesas and the second thick metal coating over the shorted mesas allow the anode contact of each laser mesa and the cathode contacts of the shorted mesas to be made on one side of the semiconductor wafer with light emission from an opposite side of the semiconductor wafer, wherein the one side of the semiconductor wafer is subject to a planarization process using a deposited insulating material and provided with two or more patterned metal pads, a first patterned metal pad providing a first planar electrical interconnection between the cathode contacts of two or more of the shorted mesas and a second patterned metal pad providing a second planar electrical interconnection for the anode contact of one or more of the laser mesas, the first planar electrical interconnect being separate from the second planar interconnection; and wherein the one side of the semiconductor wafer, after singulation of the semiconductor die from the semiconductor wafer, is configured to be directly soldered to a printed circuit board as a surface-mount component with no additional packaging needed.

22. The array of claim 21, further comprising a trench or implanted region or a combination thereof to electrically isolate one or more of the laser mesas and one or more of the shorted mesas from the other mesas among the plurality of mesas by rendering an area of the first intracavity contact layer nonconducting, and wherein the two or more patterned metal pads are patterned after planarization so the isolated mesas can be separately electrically contacted through metallic posts or bumps from the printed circuit board.

23. The array of claim 21, wherein the semiconductor wafer includes a mechanically or chemically thinned substrate and an anti-reflection coating.

24. The array of claim 21, wherein the semiconductor wafer includes a substrate including lenses etched into the substrate in alignment with the laser mesas so that light beam properties of each laser mesa can be altered through selection of a lens profile and an offset for each lens, wherein the offset alters an alignment of each lens from a laser axis of a corresponding laser mesa.

25. The array of claim 21, wherein the semiconductor wafer includes a substrate including a diffractive optical element etched into the substrate in alignment with the laser mesas so that light beam properties of each laser mesa can be altered by the diffractive optical element, wherein the light beam properties include divergence, shape and direction.

26. The array of claim 21, wherein the semiconductor wafer includes a substrate including vias etched in the substrate that are aligned to apertures of the laser mesas so that substrate absorption is reduced for low loss operation at wavelengths that would be absorbed by the substrate during laser transmission.

27. The array of claim 21, wherein the semiconductor wafer includes a substrate that is removed by mechanical and chemical means and replaced with a transparent support substrate that can be bonded for mechanical support.

28. The array of claim 21, wherein the semiconductor wafer includes a substrate that is removed by mechanical and chemical means and replaced with a transparent support substrate including lenses or other diffractive surfaces aligned with the laser mesas so that light beam properties can be altered, the light beam properties including one or more of divergence, shape and direction.

29. The array of claim 21, wherein the semiconductor wafer includes a substrate that is removed by mechanical and chemical means and replaced with a transparent support substrate including reflective coatings that can be bonded to the surface of the first intracavity contact layer to provide an external laser cavity for each laser mesa.

30. The array of claim 21, wherein the semiconductor wafer includes a substrate that is removed by mechanical and chemical means and replaced with a transparent support substrate including convex or concave lens surfaces and reflective coatings that can be bonded to the surface of the first intracavity contact layer to provide an external laser cavity for each laser mesa.

31. The array of claim 21, wherein the semiconductor wafer includes a substrate that is removed by mechanical and chemical means and replaced with a replacement support substrate that includes a glass or crystal solid state laser gain medium with reflective coatings that can be bonded to the surface of the first intracavity contact layer to provide a VCSEL-pumped solid state laser array.

32. The array of claim 21, further comprising conductive metal pads, posts or bumps provided as electrical contacts on the two or more patterned metal pads, wherein the two or more patterned metal pads have a size, a pitch and a height so that conventional printed circuit fabrication techniques can use the conductive metal pads, posts or bumps as solder pads.

33. The array of claim 32, further comprising an under-bump metallization on one or more of each anode contact and the cathode contacts to prevent intermetallic diffusion and solder pre-tinned to surfaces of one or more of each anode contact and the cathode contacts.

34. The array of claim 32, further comprising an under-bump metallization on one or more of each anode contact and the cathode contacts to prevent intermetallic diffusion and solder balls pre-attached to one or more of each anode contact and the cathode contacts.

35. The array of claim 21, further comprising a second dielectric planarization layer applied to one or more of each anode contact and the cathode contacts to protect exposed sides of one or more of each anode contact and the cathode contacts or electrical connections thereto, to provide additional mechanical support, and to prevent contamination in spaces between one or more of each anode contact and the cathode contacts and the electrical connections thereto.

36. The array of claim 21, further comprising a solder-wetting barrier patterned on the one side to limit solder wetting to the two or more patterned metal pads, wherein the two or more patterned metal pads have a size, a pitch and a height so that conventional printed circuit fabrication techniques can use the two or more patterned metal pads as solder pads.

37. The array of claim 36, further comprising solder pre-tinned to surfaces of one or more of each anode contact and the cathode contacts.

38. The array of claim 36, further comprising solder balls pre-attached to one or more of each anode contact contacts and the cathode contacts.

39. The array of claim 36, further comprising a trench or implanted region or a combination thereof to electrically isolate one or more of the laser mesas and one or more of the shorted mesas from other mesas among the plurality of mesas by rendering an area of the first intracavity contact layer nonconducting, and wherein the two or more patterned metal pads are patterned after planarization so the isolated mesas can be separately electrically contacted by pads of the printed circuit board.

40. The array of claim 21, further comprising a protective metallic coating over at least the two or more patterned metal pads to prevent corrosion and to prevent diffusion from common solders.

41. An array of vertical-cavity surface-emitting lasers or other semiconductor light-emitting devices on a single semiconductor die, comprising:
  a first distributed Bragg reflector (DBR) including a first intracavity contact layer configured to allow lateral conduction across the semiconductor wafer;
  a second intracavity contact layer and p-n junction gain regions between the first DBR and the second intracavity contact layer;
  an annular ohmic contact patterned on the second intracavity contact layer, the annular ohmic contact having a central opening sized appropriate to not cause excess diffraction loss for a laser aperture;
  a second DBR deposited on the annular ohmic contact so that the second DBR is in contact with the second intracavity contact layer exposed at the central opening of the ohmic annular contact;
  a plurality of mesas fabricated by etching layers through the second DBR, the second intracavity contact layer, the p-n junction gain regions, and a portion of the first DBR to the first intracavity contact layer so that the p-n junction gain regions of the mesas are separated and the first intracavity contact layer is exposed for making electrical contact to a surface of the first intracavity contact layer, wherein a circumference of the second DBR is smaller than a circumference of the annular ohmic contact so the annular ohmic contact is exposed for electrical connection, wherein the plurality of mesas include shorted mesas and laser mesas;
  a metallic contact deposited on the first intracavity contact layer configured to conduct current laterally from near each of the laser mesas to connect to the shorted mesas to reduce current spreading loss in the first intracavity contact layer;
  each laser mesa being insulated on sides of a laser mesa structure by a dielectric layer that prevents shorting of each p-n junction gain region of each laser mesa so that current flows through each p-n junction gain region of each laser mesa to emit light;
  a first thick metal coating applied over the second DBR and the annular ohmic contact and the insulated sides of each laser mesa to provide protection from corrosion and additional heat sinking and to form an anode contact to each laser mesa;
  each shorted mesa including an ohmic contact at a top of a shorted mesa structure and being insulated over the ohmic contact and sides of the shorted mesa structure; and
  a second thick metal coating applied over the insulated ohmic contact and the insulated sides of each shorted mesa structure to provide an electrical connection between each shorted mesa and the first intracavity contact layer so that current is shunted past each p-n junction gain region and to form cathode contacts to the shorted mesas through the first intracavity contact layer;
  wherein the first thick metal coating over the laser mesas and the second thick metal coating over the shorted mesas allow the anode contact of each laser mesa and the cathode contacts of the shorted mesas to be made on one side of the semiconductor wafer with light emission from an opposite side of the semiconductor wafer;
  wherein the one side of the semiconductor wafer is subject to a planarization process using a deposited insulating material and provided with two or more patterned metal pads, a first patterned metal pad providing a first planar electrical interconnection between the cathode contacts of two or more of the shorted mesas and a second patterned metal pad providing a second planar electrical interconnection for the anode contact of one or more of the laser mesas, the first planar electrical interconnect being separate from the second planar interconnection; and
  wherein the one side of the semiconductor wafer, after singulation of the semiconductor die from the semiconductor wafer, is configured to be directly soldered to a printed circuit board as a surface-mount component with no additional packaging needed.

42. The array of claim 41, further comprising a trench or implanted region or a combination thereof to electrically isolate one or more of the laser mesas and one or more of the shorted mesas from the other mesas among the plurality of mesas by rendering an area of the first intracavity contact layer nonconducting, and wherein the two or more patterned metal pads are patterned after planarization so the isolated mesas can be separately electrically contacted through metallic posts or bumps from the printed circuit board.

43. The array of claim 41, wherein the semiconductor wafer includes a mechanically or chemically thinned substrate and an anti-reflection coating.

44. The array of claim 41, wherein the semiconductor wafer includes a substrate including lenses etched into the substrate in alignment with the laser mesas so that light beam properties of each laser mesa can be altered through selection of a lens profile and an offset for each lens, wherein the offset alters an alignment of each lens from a laser axis of a corresponding laser mesa.

45. The array of claim 41, wherein the semiconductor wafer includes a substrate including a diffractive optical element etched into the substrate in alignment with the laser mesas so that light beam properties of each laser mesa can be altered by the diffractive optical element, wherein the light beam properties include divergence, shape and direction.

46. The array of claim 41, wherein the semiconductor wafer includes a substrate including vias etched in the substrate that are aligned to apertures of the laser mesas so that substrate absorption is reduced for low loss operation at wavelengths that would be absorbed by the substrate during laser transmission.

47. The array of claim 41, wherein the semiconductor wafer includes a substrate that is removed by mechanical and chemical means and replaced with a transparent support substrate that can be bonded for mechanical support.

48. The array of claim 41, wherein the semiconductor wafer includes a substrate that is removed by mechanical and chemical means and replaced with a transparent support substrate including lenses or other diffractive surfaces aligned with the laser mesas so that light beam properties can be altered, the light beam properties including one or more of divergence, shape and direction.

49. The array of claim 41, wherein the semiconductor wafer includes a substrate that is removed by mechanical and chemical means and replaced with a transparent support substrate including reflective coatings that can be bonded to the surface of the first intracavity contact layer to provide an external laser cavity for each laser mesa.

50. The array of claim 41, wherein the semiconductor wafer includes a substrate that is removed by mechanical and chemical means and replaced with a transparent support substrate including convex or concave lens surfaces and reflective coatings that can be bonded to the surface of the first intracavity contact layer to provide an external laser cavity for each laser mesa.

51. The array of claim 41, wherein the semiconductor wafer includes a substrate that is removed by mechanical and chemical means and replaced with a replacement support substrate that includes a glass or crystal solid state laser gain medium with reflective coatings that can be bonded to the surface of the first intracavity contact layer to provide a VCSEL-pumped solid state laser array.

52. The array of claim 41, further comprising conductive metal pads, posts or bumps provided as electrical contacts on the two or more patterned metal pads, wherein the two or more patterned metal pads have a size, a pitch and a height so that conventional printed circuit fabrication techniques can use the conductive metal pads, posts or bumps as solder pads.

53. The array of claim 52, further comprising an under-bump metallization on one or more of each anode contact and the cathode contacts to prevent intermetallic diffusion and solder pre-tinned to surfaces of one or more of each anode contact and the cathode contacts.

54. The array of claim 52, further comprising an under-bump metallization on one or more of each anode contact and the cathode contacts to prevent intermetallic diffusion and solder balls pre-attached to one or more of each anode contact and the cathode contacts.

55. The array of claim 41, further comprising a second dielectric planarization layer applied to one or more of each anode contact and the cathode contacts to protect exposed sides of one or more of each anode contact and the cathode contacts or electrical connections thereto, to provide additional mechanical support, and to prevent contamination in spaces between one or more of each anode contact and the cathode contacts and the electrical connections thereto.

56. The array of claim 41, further comprising a solder-wetting barrier patterned on the one side to limit solder wetting to the two or more patterned metal pads, wherein the two or more patterned metal pads have a size, a pitch and a height so that conventional printed circuit fabrication techniques can use the two or more patterned metal pads as solder pads.

57. The array of claim 56, further comprising solder pre-tinned to surfaces of one or more of each anode contact and the cathode contacts.

58. The array of claim 56, further comprising solder balls pre-attached to one or more of each anode contact and the cathode contacts.

59. The array of claim 56, further comprising a trench or implanted region or a combination thereof to electrically isolate one or more of the laser mesas and one or more of the shorted mesas from other mesas among the plurality of mesas by rendering an area of the first intracavity contact layer nonconducting, and wherein the two or more patterned metal pads are patterned after planarization so the isolated mesas can be separately electrically contacted by pads of the printed circuit board.

60. The array of claim 41, further comprising a protective metallic coating over at least the two or more patterned metal pads to prevent corrosion and to prevent diffusion from common solders.

* * * * *